US008541122B2

(12) United States Patent
Fulop et al.

(10) Patent No.: US 8,541,122 B2

(45) **Date of Patent: *Sep. 24, 2013**

(54) LITHIUM RECHARGEABLE CELL WITH REFERENCE ELECTRODE FOR STATE OF HEALTH MONITORING

(75) Inventors: Ricardo Fulop, Lexington, MA (US); Yet-Ming Chiang, Framingham, MA (US); Karen E. Thomas-Alyea, Arlington, MA (US); William H. Gardner, East Freetown, MA (US)

(73) Assignee: A123 Systems LLC, Livonia, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/448,999

(22) Filed: Apr. 17, 2012

(65) Prior Publication Data

US 2012/0263986 A1 Oct. 18, 2012

Related U.S. Application Data

(63) Continuation of application No. 12/210,812, filed on Sep. 15, 2008, now Pat. No. 8,163,410.

(60) Provisional application No. 60/993,802, filed on Sep. 14, 2007, provisional application No. 60/994,089, filed on Sep. 17, 2007.

(51) Int. Cl.

| | |
|---|---|
| ***H01M 2/02*** | (2006.01) |
| ***H01M 10/44*** | (2006.01) |
| ***H01M 4/13*** | (2010.01) |
| *H01M 6/00* | (2006.01) |
| *H01M 4/00* | (2006.01) |

(52) U.S. Cl.

USPC ................. 429/61; 429/50; 429/92; 429/163; 429/246; 429/248; 429/231.95; 429/231.8; 429/231.5

(58) Field of Classification Search

None

See application file for complete search history.

(56) References Cited

U.S. PATENT DOCUMENTS 2,332,456 A * 10/1943 McEachron et al. .......... 429/169
5,105,156 A 4/1992 Bohmer (Continued)

FOREIGN PATENT DOCUMENTS

EP 1577914 A1 9/2005
EP 1577914 A1 * 9/2005

(Continued)

OTHER PUBLICATIONS

European Search Report for European Patent Application No. 08830896.0 mailed Jun. 11, 2012. 6 pages.

(Continued)

*Primary Examiner* — Krishnan S Menon

(74) *Attorney, Agent, or Firm* — Wilmer Cutler Pickering Hale and Dorr LLP

(57) ABSTRACT

A battery management system includes one or more lithium ion cells in electrical connection, each said cell comprising: first and second working electrodes and one or more reference electrodes, each reference electrode electronically isolated from the working electrodes and having a separate tab or current collector exiting the cell and providing an additional terminal for electrical measurement; and a battery management system comprising a battery state-of-charge monitor, said monitor being operable for receiving information relating to the potential difference of the working electrodes and the potential of one or more of the working electrodes versus the reference electrode.

19 Claims, 12 Drawing Sheets

(56) References Cited

U.S. PATENT DOCUMENTS

| | | | | |
|---|---|---|---|---|
| 5,130,658 | A | 7/1992 | Bohmer | |
| 5,304,433 | A | 4/1994 | Cherng | |
| 8,163,410 | B2 | 4/2012 | Fulop et al. | |
| 2005/0233220 | A1 * | 10/2005 | Gozdz et al. | 429/231.95 |
| 2006/0284617 | A1 | 12/2006 | Kozlowski et al. | |
| 2007/0182418 | A1 | 8/2007 | Reynier et al. | |

FOREIGN PATENT DOCUMENTS

| | | | |
|---|---|---|---|
| JP | 61245471 | A | 10/1986 |
| JP | H11067280 | | 3/1999 |
| JP | 2001015177 | A | 1/2001 |
| JP | 2007193986 | A | 8/2007 |
| KR | 1020050028798 | | 3/2005 |
| WO | WO-2005076936 | A2 | 8/2005 |
| WO | WO-2007117263 | A2 | 10/2007 |

OTHER PUBLICATIONS

International Search Report and Written Opinion, International Patent Application No. PCT/US08/76427, mailed May 15, 2009 (7 pages).

Nanjundaswamy, et al., “Synthesis, Redox Potential Evaluation and Electrochemical Characteristics of NASICON-Related 3D Framework Compounds”, Solid State Ionics, 92:1-10 (1996).

Ohzuku, et al., “Topotatic Two-Phase Reaction of Ruthenium Dioxide (Rutile) in Lithium Nonaqueous Cell”, J. Electrochem. Soc., 137(10):3004-3010 (1990).

Song, J.Y. et al. “Two- and Three-electrode Impedance Spectroscopy of Lithium-Ion Batteries.” *Journal of Power Sources*. 111 (2002), p. 255-267.

* cited by examiner

LITHIUM RECHARGEABLE CELL WITH REFERENCE ELECTRODE FOR STATE OF HEALTH MONITORING

CROSS-REFERENCE TO RELATED APPLICATIONS

This application is a continuation of and claims the benefit under 35 U.S.C. §120 of U.S. application Ser. No. 12/210,812, filed Sep. 15, 2008, which claims the benefit under 35 U.S.C. §119(e) of U.S. Application No. 60/993,802, filed Sep. 14, 2007; and U.S. Patent Application No. 60/994,089, filed Sep. 17, 2007, the contents of which are incorporated by reference herein in their entireties.

TECHNICAL FIELD

This application relates to monitoring state of charge and/or state of health of batteries. More particularly, this application relates to batteries, battery monitoring systems, and methods of improving battery performance by monitoring state of charge and/or state of health of batteries.

BACKGROUND

State of charge (SOC) monitoring is desirable or necessary in many battery applications, including portable electronics products such as wireless communications devices and laptop computers, power tools, electric vehicles (including hybrid, plug-in hybrid, and all-electric vehicles), backup power systems, energy storage for power generation devices such as solar or wind collectors or fuel cells or conventional fuel-burning power sources, and the like. A battery, or string of batteries forming a battery pack, may be used over a limited range of SOC or over a wide range including the entire capacity available from the battery.

Accurate knowledge of the state of charge (SOC) and state of health (SOH) of a battery is important for many applications, and especially so for long-life, high charge or high discharge rate applications such as hybrid electric vehicles (HEVs), plug-in hybrid electric vehicles (PHEVs), and electric vehicles (EVs). In hybrid electric vehicles, it is especially desirable to monitor the state of charge of the battery since operation does not typically use the whole range of SOC and typically uses an SOC range that is centered around approximately 50% SOC, for example, within approximately 10-90% or 40-60% of SOC. Monitoring SOC and SOH can be difficult if the voltage of the battery varies relatively little with the SOC, or if the voltage is time-dependent at a constant SOC, or if hysteresis of voltage occurs so that the cell voltage is charge/discharge history-dependent.

There are a number of situations in which it is desirable to know the potential of each electrode in an electrochemical cell with some accuracy. The potential at any one electrode in a battery may undergo excursions in normal operation that brings it close to a potential that can cause damage or degrade performance or life. For example, there may be too high a potential at the positive electrode causing electrolyte degradation or an overcharged positive active material. In the case of a lithium ion battery, the potential may be too low at the negative electrode causing lithium metal plating.

As another specific example wherein detailed knowledge of the electrode potential is needed in a practical battery, consider a lithium ion battery undergoing charging at high rates. Too high a charge rate or degradation of the cell can cause the potential at the negative electrode to drop below that of lithium metal and cause lithium plating at the negative electrode, which degrades life and can create a safety concern. However, if the potential at the negative electrode were known with accuracy, a battery management system could be designed to cease charging of the cell before significant lithium plating occurs.

Another reason to monitor SOC accurately is to improve the life or safety of the battery. Some battery chemistries become unsafe at too high a charge voltage, and many chemistries degrade faster at very high or very low SOC. An accurate SOC estimate is therefore useful for optimizing the system for safety or long life.

Therefore, it may be critical to know with accuracy the potential at each electrode. However, the cell voltage, while easily measured, gives the difference in potential rather than the absolute potential, and includes various polarization contributions which may differ in magnitude between the positive and negative electrode, thereby making determination of the electrode potential difficult. New performance demands such as an HEV have created a need for better SOC/SOH monitoring. Existing reference electrodes such as lithium metal may not be suitable for lithium ion battery systems used under the above-described demanding conditions due to insufficient stability and life (e.g. drift of the reference potential) or unsuitable reference potential.

SUMMARY

Materials, cell designs, and methods of using a reference electrode incorporated into a battery are provided in order to provide improved state-of-charge (SOC) and state-of-health (SOH) monitoring over the lifetime of the battery. Simplified cell designs are provided having a reference electrode without the need for an additional port in the cell can or capping lids for the reference electrode terminal.

Reference electrodes have been used for electrochemical studies in general, but have not been designed for the purposes of monitoring negative electrode potential to reduce or prevent Li deposition upon high rate charging, or for lifetime cell monitoring. Batteries and battery systems incorporating a reference electrode according to one or more embodiments provide information useful in meeting the operating requirements that HEV, PHEV, and EV systems have in terms of power, charge/discharge rate, cycle life, and calendar life.

In one aspect, a battery is disclosed, comprising first and second working electrodes separated by at least one separator, where the first working electrode is in electrical connection with a first terminal, and the second working electrode is in electrical connection with a second terminal, one or more reference electrodes, and a can housing the working electrodes and the one or more reference electrodes, wherein the can is electrically isolated from the first and second terminals and is electrically connected to the one or more reference electrodes to provide terminals for the one or more reference electrodes.

In one or more embodiments, the battery is a lithium ion battery and the working electrodes comprise electroactive materials capable lithium uptake and release. In one or more embodiments, the battery comprises a cylindrical cell of wound construction. In one or more embodiments, the battery comprises a prismatic cell of wound or stacked construction.

In one or more embodiments of the lithium ion battery, the one or more reference electrodes are comprised of an electroactive material capable of multiphase existence to provide a substantially constant voltage between about 1 V and about 4 V with respect to Li/Li+. In other embodiments of the lithium ion battery, the one or more reference electrodes are capable of interface with a battery management system for the charging of the battery and for monitoring state of charge. In still other embodiments of the lithium ion battery, the one or more reference electrodes have as little as about 0.001% and up to as much as about 20% of the coulombic capacity of the working electrodes. In yet other embodiments, the one or more reference electrodes are selected from the group consisting of lithium titanium oxide, lithium transition-metal phosphate, lithium manganese spinel, with or without substituent elements, and alloys of lithium with metals such as tin, aluminum, and antimony. In further embodiments, the one or more reference electrodes comprise lithium titanium oxide. In some embodiments, the one or more reference electrodes comprise lithium iron phosphate. In other embodiments, the battery is one of a plurality of batteries comprising a battery pack. In additional embodiments, the one or more reference electrodes are positioned at a location in the battery most susceptible to lithium plating during charge. In yet other embodiments, the one or more reference electrodes are located between the working electrodes. In other embodiments, the one or more reference electrodes are substantially adjacent to the edge of the negative electrode, and prevented from contacting the negative electrode by a porous, electronically insulating layer. And in some embodiments, the active material for the one or more reference electrodes is coated onto at least part of a wall of the can.

In some embodiments the can consists of a metal from the group comprising aluminum, copper, stainless steel, and titanium and the can provides both the reference electrode and the reference electrode terminal. In some embodiments exposed metal surfaces of the can are coated with a nonporous electrically insulating coating. In additional embodiments, the first and second terminals are located in upper and lower cover plates, respectively.

In some embodiments, the first and second terminals are electrically isolated from the can via gaskets. In other embodiments, the one or more reference electrodes are wrapped in a porous electronically isolating material that is electrochemically inert. In some of these embodiments, the porous electronically insulating material is wetted by the battery electrolyte.

In some embodiments of the lithium ion battery the one or more reference electrodes are maintained within their two-phase stoichiometry over the course of repeated voltage measurements, by compensating for the current passed during voltage measurement.

Another aspect is a method of supplying power, the method comprising installing the lithium ion battery disclosed above. In some embodiments, the method further comprises interfacing the one or more reference electrodes with a battery management system, charging the battery, and monitoring the state of charge.

In some embodiments of the lithium-ion battery, the compensation occurs by alternating measurement between the reference-to-negative electrode and positive-to-reference electrode. In other embodiments, the compensation occurs by periodically switching the connection of the voltage leads between the one or more reference electrodes and one or more working electrode. In yet other embodiments, the compensation occurs by periodically passing current between the one or more reference electrodes and either the positive or negative electrode, with the direction and amount of current determined by the amount of current passed during voltage measurement.

In other embodiments, the method of supplying power further comprises maintaining the one or more reference electrodes within their two-phase stoichiometry over the course of repeated voltage measurements, wherein the maintaining occurs by compensating for the current passed during voltage measurement. In some embodiments of the method, the compensation occurs by alternating measurement between the reference-to-negative electrode and positive-to-reference electrode. In other embodiments of the method, the compensation occurs by periodically switching the connection of the voltage leads between the one or more reference electrodes and one or more working electrodes. In yet other embodiments of the method, the compensation occurs by periodically passing current between the one or more reference electrodes and either the positive or negative electrode, with the direction and amount of current determined by the amount of current passed during voltage measurement.

In some embodiments of the lithium ion battery, the positive and/or negative electrodes are comprised of materials which posses intrinsic hysteresis greater than 1 mV.

Another aspect discloses a lithium ion battery system, comprising (a) one or more lithium ion cells in electrical connection, each said cell comprising first and second working electrodes separated by separator membranes, the working electrodes capable of lithium ion uptake and release, the first working electrode comprising a first electroactive layer on a first current collector, and the second working electrode comprising a second electroactive layer on a second current collector, and one or more reference electrodes, each reference electrode electronically isolated from the working electrodes and having a separate tab or current collector exiting the cell and providing an additional terminal for electrical measurement, and (b) a battery management system comprising a battery state-of-charge monitor, said monitor being operable for receiving information relating to the potential difference of the working electrodes and the potential of one or more of the working electrodes vs. the one or more reference electrodes.

In some embodiments of the system, the one or more reference electrodes are comprised of an electroactive material capable of multiphase existence to provide a substantially constant voltage between about 1 V and about 4 V with respect to Li/Li+. In other embodiments of the system, the one or more reference electrodes are selected from the group consisting of lithium titanium oxide, lithium transition metal phosphate, lithium manganese spinel, and alloys of lithium with metals such as tin, aluminum, and antimony. In yet other embodiments, the one or more reference electrodes are positioned at the position of the cell most susceptible to lithium plating during charge. In additional embodiments, the one or more reference electrodes are located between the working electrodes. In other embodiments, the one or more reference electrodes are immediately adjacent the edge of the negative electrode, and are prevented from contacting the negative electrode by a porous, electronically insulating layer. In yet other embodiments, the one or more reference electrodes are encapsulated by porous polyolefin separators.

In other embodiments of the system, the one or more reference electrodes are coated by a porous insulating coating comprised of a mixture of ceramic particles and binder, said ceramic particles consisting of SiO2, Al2O3, MgO, TiO2, or other electrically insulating ceramic material, and said binder consisting of poly(vinylidene difluoride), poly(tetrafluoroethylene), poly(ethylene), poly(ethylene oxide), poly(methymethacrylate), latex rubber, carboxy methyl cellulose, or other polymer. In some embodiments, all metal connected to the one or more reference electrodes, except the metal immediately covered by the active reference electrode material, is insulated with a nonporous electrically insulating coating. In other embodiments, the porous insulating layer has a thickness between 5 and 100 micrometers.

In one or more embodiments of the system, the one or more reference electrodes are placed in close proximity to the working electrodes, such that the surface of the insulating layers around the one or more reference electrodes contacts the separator separating the positive and negative electrodes. In additional embodiments, the battery is a cylindrical, prismatic or pouch battery. Other embodiments include sensors for monitoring temperature and/or current. In some embodiments, the state-of-charge monitor can monitor one or more parameters selected from the group comprising overcharge, overdischarge, excessive charge current, and excessive discharge current.

One or more embodiments also contain a balancing module. In some of these embodiments, the one or more lithium ion cells comprise cell pairs, and wherein the balancing module can evaluate the relative voltage levels of adjacent cell pairs and redistribute charge between adjacent cells to mitigate differences in the cell voltages of the pairs.

Some embodiments of the system also include a controller. In some of these embodiments, the controller can raise and/or lower the charge rate of one or more cells.

In one or more embodiments of the system, the one or more reference electrodes can allow substantially instantaneous feedback of the state-of-charge of each individual cell to the battery management system. In some of these, the battery management system can adjust the charging protocol of at least one cell in substantially real-time.

In some embodiments of the system, the system can estimate the state-of-charge. In some of these embodiments, the system can compare the estimated state-of-charge to a target state-of-charge, and wherein the battery management system can adjust the charge rate of at least one of the cells upwards or downwards.

Another aspect is a method of avoiding lithium plating in a lithium ion battery comprising measuring the potential of the negative electrode relative to a reference electrode during charging of a lithium ion battery, comparing the measured potential to a critical potential associated with the plating of lithium metal, and adjusting the charging conditions of the lithium ion battery to reduce the risk or prevent plating of lithium at the negative electrode. Some embodiments of this method include adjusting charging via terminating charging or altering the charge rate.

Another aspect is a method of minimizing charge time of a lithium-ion battery by maximizing the charge current that is applied at any particular SOC during a charging event, comprising measuring the potential of the negative electrode relative to a reference electrode during charging of the battery, said charging having a charge rate, determining the state of charge of the battery, comparing the measured state of charge to a state of charge profile, and adjusting the charge rate upwards or downwards to maintain the actual charge rate within a predetermined range that provides one or more of optimal safety operation and optimal charge rate to minimize charge time.

Another aspect is a method of detecting whether there is an electrical connection between a can and either terminal of a cell, comprising applying a material to the inside of the can, said material having a redox potential that differs from that of either terminals, where the potential difference is greater than 0.2 V, and measuring the voltage between at least one terminal and the can.

Another aspect is a method of supplying power, the method comprising implementing a lithium ion battery system selected from the group consisting of earlier disclosed lithium ion battery systems. In some of these methods, the lithium ion battery system also monitors one or more parameters selected from the group comprising overcharge, overdischarge, excessive charge current, and excessive discharge current. In one or more embodiments, the method includes evaluating the relative voltage levels of adjacent cell pairs, and redistributing charge between adjacent cells to mitigate differences in the cell voltages of the pairs. In other embodiments, the method includes raising and/or lowering the charge rate of one or more cells. In yet other embodiments, the method includes adjusting the charging protocol of at least one cell in substantially real-time. In yet other embodiments, the method includes estimating the state-of-charge.

FIGURES

A more complete appreciation of the invention and many of its advantages will be understood by reference to the description of the invention when considered in connection with the following drawings, which are presented for the purpose of illustration only and are not intended to be limiting. Other embodiments and modifications within the reach of one of ordinary skill in the art are intended to be included in the invention.

Figure 13A:
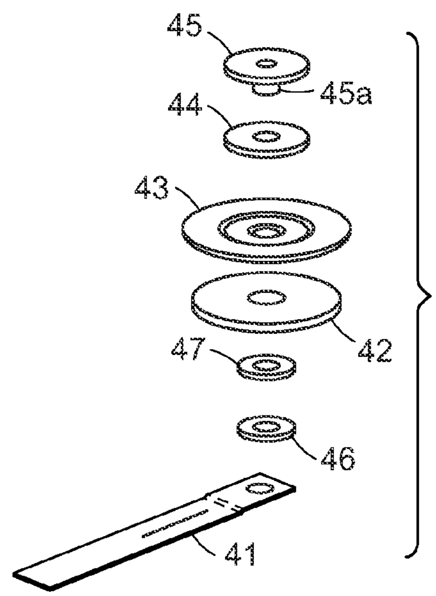
Figure 13B:
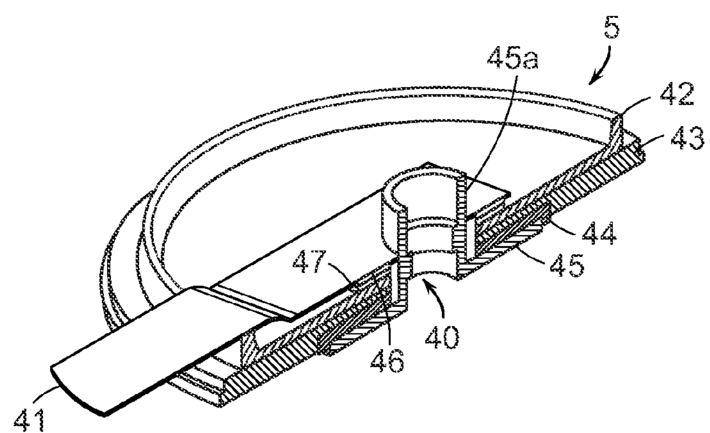
Figure 13C:
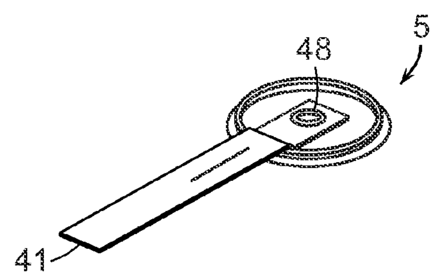

FIG. 13A-C provide an exploded view of the components used in a negative (anode) end cap assembly, including gasket for insulating negative and reference electrode terminals.

Figure 14A:
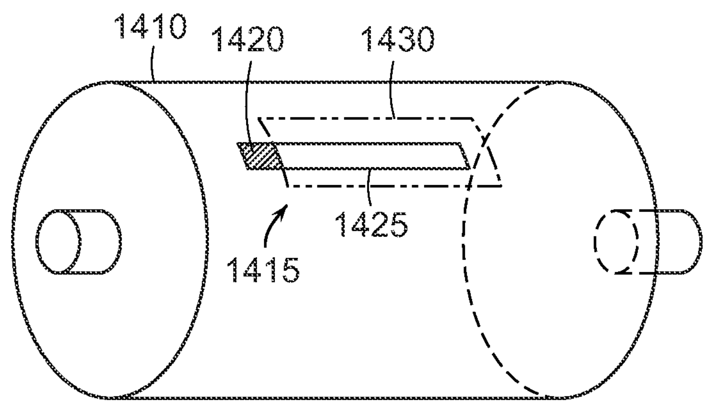
Figure 14B:
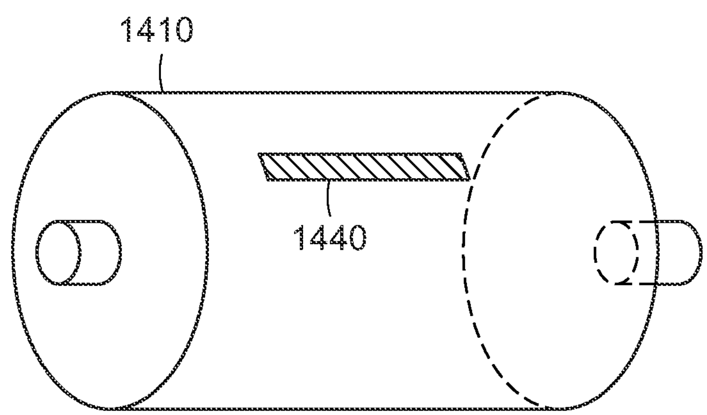

FIGS. 14A and 14B are perspective illustrations of a cylindrical cell including a reference electrode according to one or more embodiments.

DETAILED DESCRIPTION

Three-electrode cells provide a means to monitor the state of an electrochemical cell to obtain information about cell characteristics. This information can be used to determine the state of charge of a battery and other important cell characteristics. Such information is increasingly needed to monitor and optimize complex battery systems involving multiple cells with tight operating parameters, such as are found in PHEVs.

While three-electrode cells are useful in monitoring and optimizing cell performance, such systems pose certain challenges. For example, the use of an additional electrode increases the complexity of cell design. In particular, it requires reengineering of the cell architecture to accommodate a third electrode and its terminal, typically requiring an additional port in the cell container. See, e.g., EP 1577914. The additional port unnecessarily complicates the cell design and provides additional safety risks, as the port is an additional site for rupture and leakage.

In one aspect, a three electrode battery and battery system is provided with improved performance and a simplified design that does not require additional modification of the cell can design to accommodate the third electrode.

Methods for the operation, monitoring and optimization of the cell performance are also provided.

Electrochemical Cell and Battery

An electrochemical cell including one or more reference electrodes is described with reference to FIG. 1. The electrochemical cell can be of any geometry, such as a cylindrical cell of wound construction, a prismatic cell of wound or stacked construction, and the like. The electrochemical cell may be small or large, ranging in volume from less than 1 $cm^3$ to greater than 1 liter, and have charge capacity ranging from less than 0.1 Ah to greater than 100 Ah.

One or more electrochemical cells can be formed into one or more batteries. The battery can be of any geometry. For example, the battery can be a prismatic battery, a cylindrical battery, or the like. For example, lithium ion batteries are typically included in a battery pack, which includes a plurality of electrochemical cells that are electrically connected in series and/or in parallel. Lithium-ion battery packs come in all shapes, sizes, energy capacity and power rating, depending on the intended use of the battery pack. Battery packs will typically include a number of lithium ion cells and a battery management system.

All the various types of electrochemical cells and batteries/battery packs thereof are within the scope of the invention. However, it is described herein for simplicity with reference to a simple pouch electrochemical cell.

Figure 1:
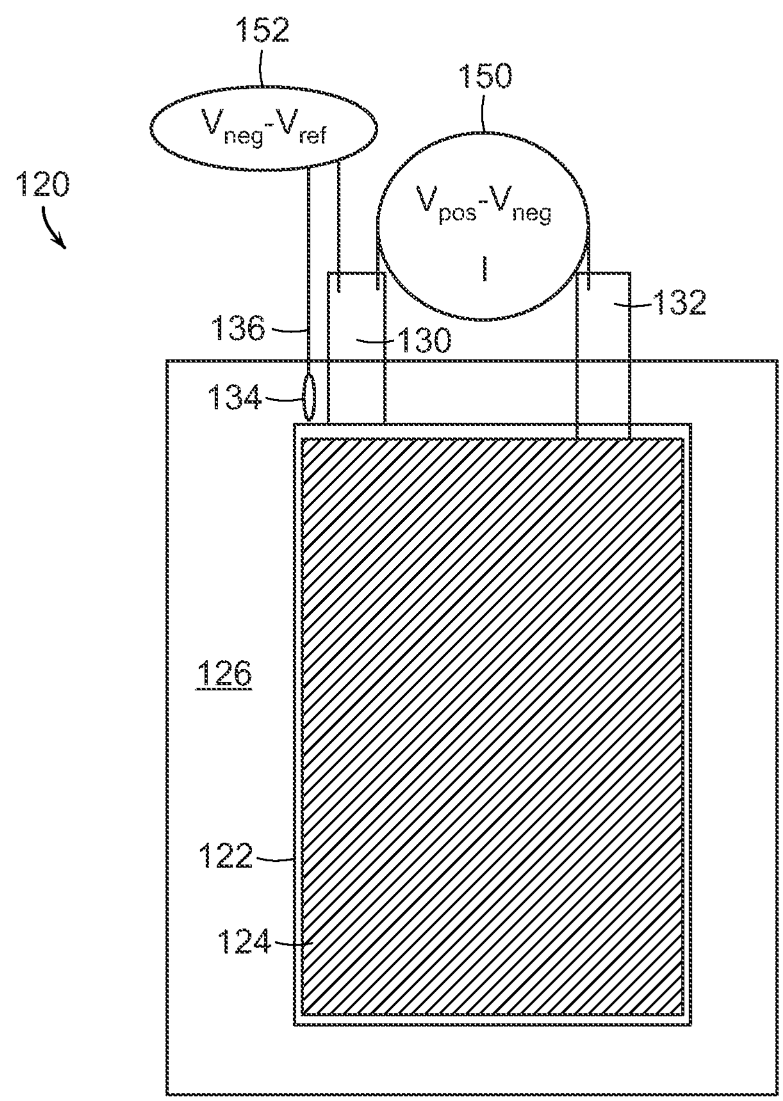
FIG. 1 is an exemplary electrochemical cell including a reference electrode according to one or more embodiments.

As shown in FIG. 1, the electrochemical cell can include a negative electrode 122 and a positive electrode 124 electronically separated by a separator 126. The negative and positive electrodes (122, 124) have separate tabs (130, 132) that serve as terminals for electrical contact with an external circuit. The cell also includes a reference electrode 134 that is electronically isolated from the working electrodes (122, 124) and has a separate tab 136 exiting the cell and providing an additional terminal for electrical measurement and control of the reference electrode. In certain embodiments as described more fully herein, the terminal for the reference electrode is the conducting can housing the cell, thereby avoiding the need to have an additional port in the battery. In certain embodiments, the reference electrode may be wrapped in a porous electronically insulating material (not shown) that is electrochemically inert and is wetted by the electrolyte, e.g. microporous polyethylene, a mixture of insulating ceramic particles with binder such as $TiO_2$ or $Al_2O_3$ with PVDF or other polymer binder, or other material commonly used for battery separators.

Positive Electrodes

The working electrodes can be any conventional positive and negative electrodes. By way of example, suitable materials for the positive electrode for a lithium ion battery include $LiCoO_2$, $LiNiO_2$, $LiMnO_2$, $LiMn_2O_4$, $LiFePO_4$, $V_2O_5$, or other such cathodes well-known to those skilled in the art, including $Li_xMO_2$, in which M can include Ni, Co, Mn, Al, Mg, Cr, or other metals, mixed with a binder and optionally a conductive additive such as carbon.

Lithium metal phosphate compounds (such as lithium-transition metal-phosphate compounds) may also be used as the electroactive material including but not limited to polyanion compounds such as olivine compounds and NASICON compounds. The lithium-metal-phosphate compound may be optionally doped with a metal, metalloid, or halogen.

Specific examples can include doped nanophosphate material, or an olivine structure compound $LiMPO_4$, where M is one or more of V, Cr, Mn, Fe, Co, and Ni, in which the compound is optionally doped at the Li, M or O-sites. Deficiencies at the Li-site can be compensated by the addition of a metal or metalloid, and deficiencies at the O-site can be compensated by the addition of a halogen.

Further information regarding suitable positive electrode materials can be found in U.S. Pat. No. 7,338,734, entitled "CONDUCTIVE LITHIUM STORAGE ELECTRODE" and United States Published Application No. 2007/0031732, entitled "NANOSCALE ION STORAGE MATERIALS" which are incorporated by reference in their entireties.

Suitable positive electrode materials for batteries with aqueous electrolytes, such as Pb-acid or nickel-cadmium batteries, include lead dioxide, nickel oxyhydroxide, and manganese dioxide.

Negative Electrodes

Suitable materials for a negative electrode for a lithium ion battery include carbon, including graphitic or amorphous or partially disordered carbons, alloys or compounds formed between Li and metal alloys comprising one or more of Sn, Si, Sb, Al, Zn, and Ag, or other anode materials known to those skilled in the art.

Suitable negative electrodes for batteries with aqueous electrolytes, such as Pb-acid or nickel-cadmium batteries, include lead, cadmium hydroxide, metal-hydride alloys, zinc, and carbon.

Reference Electrode

The selection of materials for a reference electrode will vary in the various secondary batteries such as lead-acid or Pb-A battery, alkaline-manganese battery, nickel-cadmium or 'NiCad' battery, nickel-metal hydride or 'NiMH' battery and the lithium-ion or 'Li-ion' battery.

In certain embodiments, the reference electrode can have a coulombic capacity that is small in comparison to the working electrodes, e.g., the anode and the cathode which supply the coulombic capacity of the electrochemical cell. Coulombic capacity is the amount of coulombs (current times time) that can be exchanged between the electrodes. In one or more embodiments, the reference electrode has as little as about 0.001% and up to as much as about 20% of the capacity of the working electrodes. In some embodiments, the reference electrode can occupy a small section of that total volume in order to avoid substantially decreasing the volumetric energy density of the cell.

The reference electrode material may be one of many choices. In certain embodiments, the reference electrode can include a material providing a stable reference potential over time in the cell environment. The reference electrode can be thermodynamically stable in the electrochemical environment of the cell.

For example, for lithium-ion batteries containing carbonate, ester, ether, lactone, or similar solvents, a stable reference potential can be at a high enough absolute potential that surface reactions due to electrolyte reduction (such as the well-known "solid-electrolyte interface" (SEI)) do not occur. This can be accomplished by having a reference electrode with a potential greater than about 0.8V with respect to lithium metal ($Li/Li^+$), more preferably greater than about 1.0V. Furthermore, the potential can be lower than about 4V vs. Li in order to avoid oxidative reactions with components of the electrolyte. In batteries containing an aqueous electrolyte, the reference electrode can be chosen to a potential greater than about 0 V vs. $H_2/H^+$ and less than about 1.2 V vs. $H_2/H^+$, i.e., within the stability window of water (which is a function of pH).

In another example, the reference electrode can include a material in which the potential is relatively constant even if the reference electrode is partially lithiated or delithiated while in use, such as a reference electrode in which the chemical potential is constant with degree of lithiation. Materials having a substantially constant chemical potential with degree of lithiation can include materials having more than one co-existing lithium-active phase, such as compounds that undergo a two-phase reaction upon insertion or removal of lithium. Such compounds can have a constant thermodynamically-determined potential as determined by the Gibbs phase rule. Such materials can be available with a variety of potentials, and can make desirable reference electrodes.

Exemplary (and non-limiting) reference electrode materials for Li ion batteries can include lithium titanium oxides (LTO), lithium transition metal phosphates, lithium manganese spinels (on the ~3V voltage plateau in between compositions $LiMn_2O_4$ and $LiMnO_2$), and alloys of lithium with metals such as tin, aluminum, and antimony. In other embodiments lithium metal may be used. Rutile structure compounds including $Li_xRuO_2$ and $Li_xTiO_2$, and alkali transition metal polyanion compounds, including pure or doped compositions of the compounds $Li_xMPO_4$, $Li_xMP_2O_7$, $Li_xMPO_4F$, $Li_xM_2(SO_4)_3$ and $Li_xM_2(PO_4)_3$ in which M is one or more of Ti, V, Cr, Fe, Mn, Ni or Co, and in which other alkali metals may be partially substituted for Li, all are suitable electroactive materials for the reference electrode. The reference electrode active material may be the same as, or different from, that used in one of the working electrodes of the battery. For lithium rechargeable batteries, lithium metal is one usable reference electrode material.

In one or more embodiments, a multiphase lithium active material providing a stable constant potential can be used as the reference electrode. Lithium titanium oxide (LTO) is an exemplary reference electrode material including, but not limited to, a composition $Li_{4+x}Ti_5O_{12}$ and compounds having the spinel structure. Upon lithium insertion, this composition can undergo a two-phase reaction and can provide a constant 1.55V potential at room temperature vs. $Li/Li^+$, which is high enough to avoid SEI formation. This compound can be prepared in the oxidized state. Alternatively, a two-phase material may be prepared by increasing the Li content and firing in reducing ambient atmosphere or in a closed-system firing where the relative amounts of Li, Ti and O are constrained. When using the oxidized form, upon incorporating the reference electrode into a lithium ion cell, LTO may not be a two-phase material of constant potential. However, in certain embodiments, the reference electrodes can be electrochemically lithiated by the insertion of lithium to form the two-phase state of constant potential prior to use as a reference electrode.

Other exemplary reference electrode materials can include phosphate materials, such as doped nanophosphate material, or olivine $LiMPO_4$ in which M includes one or more of Fe, Mn, Co, and Ni. The aforementioned phosphates can be lithiated to form a two-phase material of constant potential. In such embodiments, the reference electrode can be operated to avoid large cycling of the reference electrode, in order to keep the stoichiometry of the reference electrode within its two-phase region, and in order to avoid inducing changes in the potential of the reference electrode owing to the hysteresis intrinsic in some phase-change materials. The two-phase phosphate can be prepared as a starting material, or a starting reference electrode can be electrochemically lithiated or delithiated to form the two-phase material. As a non-limiting example, a two-phase $LiFePO_4$—$FePO_4$ mixture with a potential of about 3.45 V vs. Li/Li+ can be prepared by starting with an overall composition $Li_{1-x}FePO_4$ in which x is greater than about 0.05, and heat treating to create the two co-existing phases. Alternatively, the reference electrode can be $LiFePO_4$ that is delithiated in-situ after assembly to create the two-phase mixture. In yet another example, the reference electrode can be $FePO_4$ that is lithiated in-situ after assembly to a composition $Li_yFePO_4$ in which y is greater than about 0.05.

Because voltage measurements involve passage of some small amount of current, over extending voltage measurements, the stoichiometry of the reference electrode can be changed, even to the point at which all of the capacity of the reference electrode is consumed, after which the potential of the reference electrode will change. For a system design for long-term operation, one would operate the voltage measurement to avoid depleting the reference electrode. Examples of modes of operation that avoid substantially changing the stoichiometry of the reference electrode include reducing the amount of time during which voltage is measured, alternating the direction of the current passed during voltage measurement (i.e., by switching the polarity of the leads), and/or periodically passing compensating current between the reference electrode and one of the working electrodes.

The active material of the reference electrode can be deposited directly onto a metal current collector. Or, particles of active material can be mixed with a binder, conductive additive such as carbon may be added to the mixture, and coated onto metal foil. The metal foil may be copper, aluminum, nickel, stainless steel, titanium, or other metal that neither alloys nor corrodes under the operating potential window of the reference electrode.

Because the function of the reference electrode is to provide a stable measurement of the potential in a particular location in the cell, it is important to minimize factors which can affect that potential. For example, the metal lead connecting the active reference material to the reference terminal should be insulated from ionic contact with the electrolyte in all regions except the immediate region of the active reference material. In addition, the reference electrode should be placed as close as possible to the location where the potential is of interest, and there should be a continuous ionic path between the location of interest and the reference electrode. For example, if the goal is to detect lithium plating, then the reference electrode should be placed as close as possible to the negative-electrode tab, and more specifically, to the separator-negative electrode active-material interface adjacent to the negative-electrode tab.

In one or more embodiments, the reference electrode has its own terminal with which to connect a voltmeter. In one or more embodiments, the reference electrode lead connecting the reference electrode active material to the reference electrode terminal passes through a feedthrough or port through the cell wall or one of the upper or lower caps on the cell can. The feedthrough through the cell must be hermetically sealed. Such a seal can be made hermetic via a gasket, glass-to-metal seal, lamination, or other techniques known in the art.

In one or more embodiments, the reference terminal is integral with the one of the cell wall or upper or lower caps, so that an additional port or feed through is not required. For batteries with one or more reference electrode terminals, integration of the reference electrode terminals into a cell wall or an end cap provides several significant advantages over batteries that accommodate reference terminals via a feedthrough or port. Cell design of a feedthrough for a reference terminal can be complicated, costly, and less durable. The hermetic seal necessary for a feedthrough for a reference terminal adds a potential leak path to the system. Failure in such a hermetic seal could result in a battery that leaks electrolyte and could cause the entire battery to fail. The structure required for such a reference terminal feedthrough also takes up additional space in the battery. Further, such a reference terminal feedthrough adds extra weight to the battery.

Integration of a reference electrode terminal into a cell wall or an endcap makes an additional feedthrough unnecessary. As a result, a new potential leak path is not created, the space necessary to accommodate the additional feedthrough is saved, and the weight of an additional feedthrough is also saved. One result of a battery with a reference electrode terminal integrated into a cell wall or an endcap is thus that the battery can be lighter, smaller, and more durable because of the lack of an additional potential leak path.

Another advantage of embodiments that have a reference terminal integrated into a cell wall or an endcap is additional flexibility in the structure required to measure voltages. Because the reference terminal of these embodiments is electronically connected to the can, and because the can and the endcaps are electronically conductive, practically any point on the can or the endcaps can be used to measure the potential of the reference electrode. This feature provides significant flexibility in cell design, as potential across the reference electrode can be measured practically anywhere on a surface of the can or endcap.

Certain embodiments have one or more reference electrodes integrated into the can. In embodiments in which the reference electrodes are electronically connected to the can, the entire can effectively becomes the reference terminal. When the can effectively becomes the reference terminal, the can must be electrically separated from the endcaps in order to maintain the electrodes at different potentials. Gaskets thus provide electrical separation between the cell endcaps and can 830. Further information regarding suitable gaskets can be found in co-pending U.S. application Ser. No. 11/515,597, entitled "BATTERY CELL DESIGN AND METHOD OF ITS CONSTRUCTION" which is incorporated by reference in its entirety.

FIG. 13 is an illustration of an endcap including a gasket that may be used according to one or more embodiments of the invention to electronically isolate the positive and/or negative terminal from the can. FIGS. 13A-13C depict a negative end cap (5) including a centrally located fill hole (40). The fill hole is used to activate the cell once assembled and is defined, at least in part, by a hollow bore rivet (45) which makes up the power terminal. Dual use of the central location of the negative end cap as both a fill hole and as a power terminal provides efficient use of space and does not interfere with battery operation. The fill hole (40) is centrally located in the end cap face. The centrally located fill hole provides a feed through inlet fittingly disposed within the hole and connecting to the interior of the cell. Electrolyte is introduced through this feed through inlet during activation.

The negative end cap is constructed by assembling the constituent components as illustrated in the exploded diagram of FIG. 13A. Upper gasket (44) is placed into end cap body (43), which may contain a depression for receiving the gasket. The hollow bore rivet serving as the power terminal (45) is assembled into upper gasket (44). The stem (**45*a*) of rivet (45) extends through a central opening of both the upper gasket (44) and end cap body (43). The assembly is flipped over, and seal gasket (47) is inserted onto gasket (44) and placed onto body (43). Lower gasket (42), seal gasket (47), and rivet backing disc (46) are assembled and positioned as illustrated in FIG. 4A. Extension tab (41) is inserted onto the stem of rivet (45). The as-assembled components, prior to crimping are shown in FIG. 13**B.

Rivet (45) may be Ni plated steel for both good corrosion resistance and good weldability, which serves as the power terminal for the cell. The flat head of rivet (45) extends over a portion of the external face of the end cap and the hollow stem (**45*a*) extends into the interior of the cell. It also includes a fill hole through its center with an engineered ledge to help sealing, a symmetric shape, and a centralized rivet stem for sharing space and symmetry between the battery terminal and the fill hole. Extension tab (41) connects the power terminal (45) with the cell's internal active anode material. A lower gasket (42) protects the extension tab (41) from contacting the end cap body (43), which is at a different voltage potential. Body (43) is hermetically sealed to the battery tube (not shown) or the main body of the cell through any number of methods, including but not limited to the aforementioned methods of crimping and welding. Upper gasket (44) insulates the power terminal (45) from the end cap body (43), which are at different voltage potentials. Rivet backing disc (46) helps to create a robust press-rivet clamp force onto body (43). Seal gasket (47**) helps to achieve a robust seal underneath the press-rivet.

The entire assembly may be crimped together by pressing and deforming the stem of rivet (45), as illustrated in FIG. 13C, squeezing all of the parts together to form press-rivet (48) and creating a good electrical contact between the extension tab (41) and the power terminal (45).

The same technique can be applied to create the positive terminal of the cell. However, at the positive terminal of the cell, rivet (45), extension tab (41), and rivet backing disc (46) are preferably comprised of aluminum, aluminum alloy or a material resistant to corrosion at the positive cell potential. Such materials may include stainless steel, molybdenum, hastelloy, or other known corrosion resistant alloys.

Other methods and gaskets may be employed as will be readily apparent to one of skill in the art.

The addition of gasketed endcaps in order to electrically isolate the working terminals from the can in some embodiments that integrate the reference terminal into the can does not eviscerate the savings attributable to the integrated reference terminal. The weight, space requirements, and leakage potential of gasketed endcaps are all smaller than for an additional feedthrough to accommodate a reference electrode terminal, thus retaining the benefits of the integrated reference terminal in these embodiments.

Another concern when a reference electrode is added to a battery is that the reference electrode must be insulated from the working cells. This typically requires an insulating material to be placed around the reference electrode or between the reference electrode and the working electrodes to isolate the components in the battery. In embodiments in which the reference terminal is integrated into the can or the endcaps by having the active material for the reference electrode coated onto at least a part of a can wall or endcap, the process of insulating the active material of the reference electrode is simplified, as the coated active material need only be covered by the insulation.

Another benefit in embodiments in which a reference electrode is integrated into the can or an endcap is maintaining contact between the reference electrode and the battery electrolyte. This is because the electrolyte is in fluid contact with the interior of the can and endcaps, and thus will also be in contact with the reference electrode in certain embodiments.

In still other embodiments, the can itself may serve as a pseudoreference electrode, further simplifying the design of the cell. In instances where the can is a metal such as aluminum, copper, stainless steel or titanium, the can is capable of serving as the reference electrode. The interior wall surface of the can be coated with protective insulating material to provide electronic insulation of the can from the working electrodes. Exemplary protective insulating materials that may be used to coat the inside surface of the can include polymers such as polyisobutylene, polyolefin, and epoxy, or ceramics such as alumina and zirconia. A suitable connection can be made at any point along the exterior wall of the can to create a circuit capable of measuring the potential of the reference electrode v. negative electrode.

Advantages of the Reference Electrode

The incorporation of a specific reference electrode provides a range of monitoring capabilities to the electrochemical cell. The information obtained by the reference electrode can be provided to a battery monitoring system. Accurate measurement of the electrode potential permits accurate determination of the cell's state of charge, since state of charge is directly correlated to the potential difference between either working electrode and the reference electrode. Furthermore, for systems in which the impedance is SOC-dependent, accurate measurement of the electrode potential also provides information about electrode impedance. The battery monitoring system can use this and other information, such as cell voltage, current, and temperature, to control the various functions of the individual electrochemical cells and the overall battery system. Battery management systems can therefore be developed to accurately monitor the state of charge and implement management of the battery state of health based on this information. In one or more embodiments, battery monitoring systems are provided that monitor the negative electrode potential to prevent Li deposition upon high rate charging. In other embodiments, battery monitoring systems are provided to minimize charge time by maximizing the charge current that is applied at any particular SOC.

1. State of Charge Determination

The state of charge (SOC) is defined as a percentage of the capacity that the battery exhibits between a lower voltage limit at which the battery is fully discharged at equilibrium, and an upper voltage limit at which the battery is fully charged at equilibrium. Thus a 0% SOC corresponds to the fully discharged state and 100% SOC corresponds to the fully charged state. State of health (SOH) is a measure of the battery's present ability to deliver power and energy, and typically includes information related to changes in cell impedance and capacity.

A voltage can be imposed across the positive and negative electrodes by creating a circuit 150, or electrical connection, between the two terminals 130, 132. The voltage is the difference between the potentials of the positive and negative electrodes. Although the difference can be obtained, the absolute values of a single electrode cannot be measured. Generally, the cell voltage is suitable in determining SOC for the electrochemical cell if one or both of the electrodes shows a change in potential with SOC. In fact, SOC is conventionally determined in this manner. However, there are circumstances in which the cell voltage is a poor indicator of cell state of charge. For example, in the case where both electrodes show a variation of potential with state of charge, but the cell undergoes degradation reactions that change the stoichiometry of either or both electrodes over time, then cell voltage is no longer a reliable indicator of the state of charge of the electrodes. Intrinsic hysteresis in either or both working electrodes can also introduce uncertainty in the relationship between cell voltage and state of charge. Finally, polarization induced by the passage of current changes the cell voltage; a reference electrode enables one to identify how much polarization is attributed to one or the other electrode.

Intrinsic hysteresis in either or both working electrodes can cause problems using voltage to monitor SOC. This is because in materials with high hysteresis, SOC at a given voltage can be a function of the charge and/or discharge history. The use of a reference electrode can allow a system with intrinsic hysteresis to monitor SOC more accurately by separately monitoring the potential of the positive and/or negative electrodes against the reference electrode. This is because there is less hysteresis in the potential of the negative electrode vs. reference electrode or positive electrode vs. reference electrode than in the overall cell voltage, which contains contributions to hysteresis from both the negative and positive electrode.

Accordingly, in certain embodiments, the potential of the positive and/or negative electrodes can be determined or controlled using a reference electrode. In certain embodiments, the reference electrode can be chosen so that the variation in potential as a function of its stoichiometry at the reference electrode is much more stable than the variation of potential at the negative or positive electrodes. In some other embodiments, the variation in potential as a function of SOC at one or both of the working electrodes is much more stable than the variation of potential at the reference electrode.

For example, a circuit 152 may be created between the reference electrode 134 and the negative electrode 122, where the reference electrode is much more stable to variation in potential as a function its stoichiometry than the negative electrode. Because the reference electrode is selected for its stability, the measurements and changes in potential can be indicative of conditions at the negative electrode and SOC can be determined by measuring the difference.

As another non-limiting example, a circuit may be created between the reference electrode 134 and the positive electrode 124, where the reference electrode is much more stable to variation in potential as a function of SOC than the positive electrode. Because the reference electrode is selected for its stability, the measurements and changes in potential can be indicative of conditions at the positive electrode and SOC can be determined by measuring the difference.

In certain embodiments, the reference electrode can be located within the cell at a location where the potential varies the greatest, or where the consequences of undesirable potential excursions are the most severe. For example, in a large cell, where the electrical potential and polarization and temperature may vary from location to location, the reference electrode may be situated at locations where such variations are the most extreme. For example, the reference electrode can be placed just outside the active area of the negative electrode, where lithium plating upon rapid charging can occur.

In some other embodiments, one or more reference electrodes can be distributed at various locations within a single cell to monitor the spatial variations in the electrochemical potential in the electrolyte. Each reference electrode would have an independent terminal.

2. Battery Management System

As discussed above, battery packs can include a number of electrochemical cells and a battery management system. The battery management system can include sensors for monitoring temperature, current, and voltage, a voltage converter and regulator circuit to maintain safe levels of voltage and current; an electrical connector that lets power and information flow in and out of the battery pack, and a battery charge state monitor, which estimates the present state of charge of the battery. The battery monitors can further accumulate data related to battery parameters and then transmit it to a host processor. Battery monitors can include mixed signal integrated circuits that incorporate both analog and digital circuits, such as one or more types of digital memory and special registers to hold battery data.

Some exemplary parameters that can be monitored by the battery management system include overcharge (overvoltage), overdischarge (undervoltage) and excessive charge and discharge currents (overcurrent, short circuit), information of particular importance in Li-ion battery systems. In certain embodiments, a battery monitor can assume some of the functions of a protection circuit by protecting the battery from harmful overcharging and overcurrent conditions.

Figure 2:
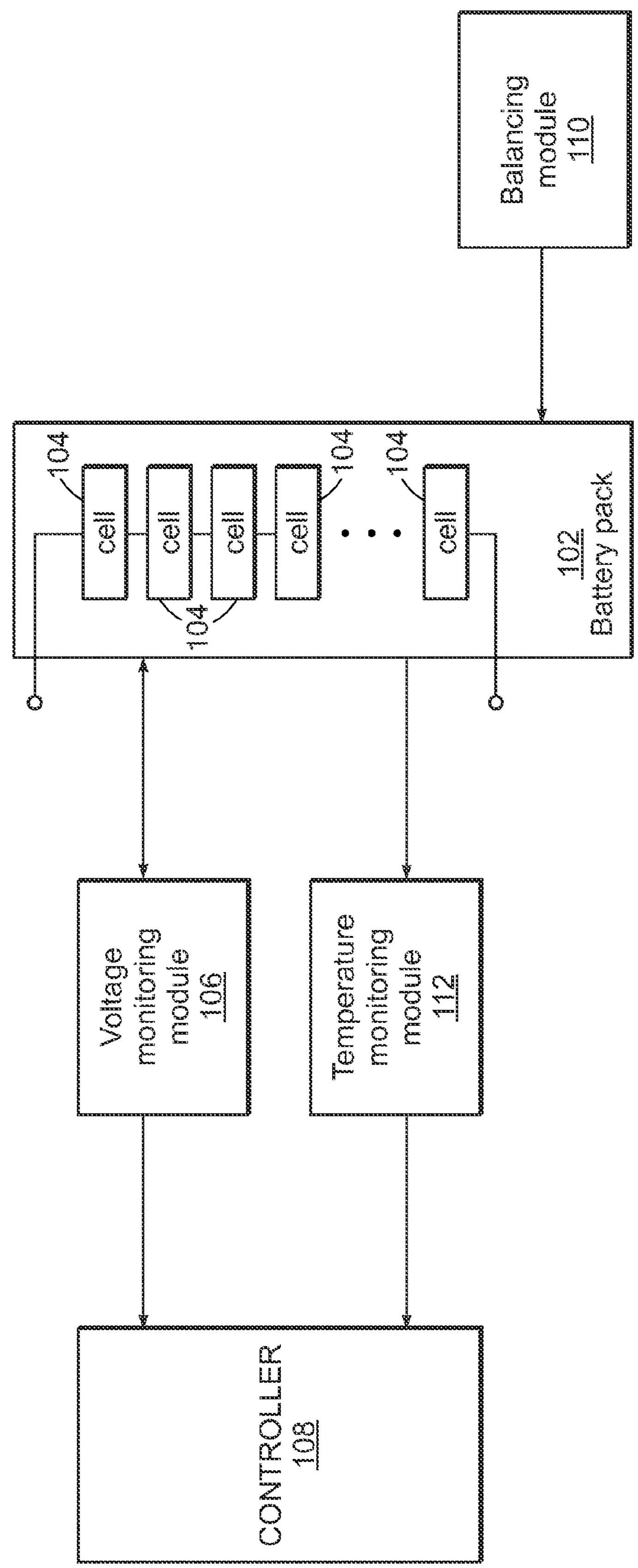
FIG. 2 is an exemplary battery pack according to one or more embodiments.

FIG. 2 is an exemplary block diagram illustrating the general functionality provided by a battery system and method for monitoring and balancing battery packs. A battery pack 102 can include one or more energy delivery devices 104 (e.g., lithium cells), electrically connected in series and/or in parallel.

A voltage monitoring module 106 can receive voltage information associated with each of the energy delivery devices 104, condition and isolate the voltage information and provide the voltage information via an output port to a system controller 108. The system controller 108 can evaluate each of the energy delivery devices 104 during charging and discharging to determine if any individual energy delivery device 104 is in a potentially damaging state. For example, during charging, an individual cell may reach or exceed a safe voltage level even though the overall pack voltage is still below a safe level. Similarly, during discharge, the voltage of an individual cell may drop below a minimum safety threshold even though the voltage of the overall battery pack is still above its minimum safety threshold. In such events, the system controller 108 can discontinue charging or discharging the battery pack 102 (or the individual cell) when the system controller 108 detects an individual cell voltage at an undesired value.

A balancing module 110 can evaluate the relative voltage levels of adjacent cell pairs and redistribute charge between the adjacent cells to mitigate differences in the cell voltages of the pair. As will be described in more detail below, the balancing module 110 can include functionality for preventing excessive cell discharge of one cell in the event the other of the cell pair is removed or otherwise disconnected.

A temperature monitoring module 112 can receive information corresponding to the temperature of the battery pack 102. The temperature information can be in the form of an electrical signal produced by a thermocouple located within the battery pack, although the temperature information can take other forms known in the art. The temperature monitoring module 112 can provide the temperature information to the system controller 108. The temperature monitoring module may also receive temperature information from other battery packs (not shown) and provide the temperature information from multiple battery packs to the system controller 108. This description is provided for the purpose of illustration only and in not intended to be limiting of the invention.

3. Battery Charging Monitoring

Figure 3:
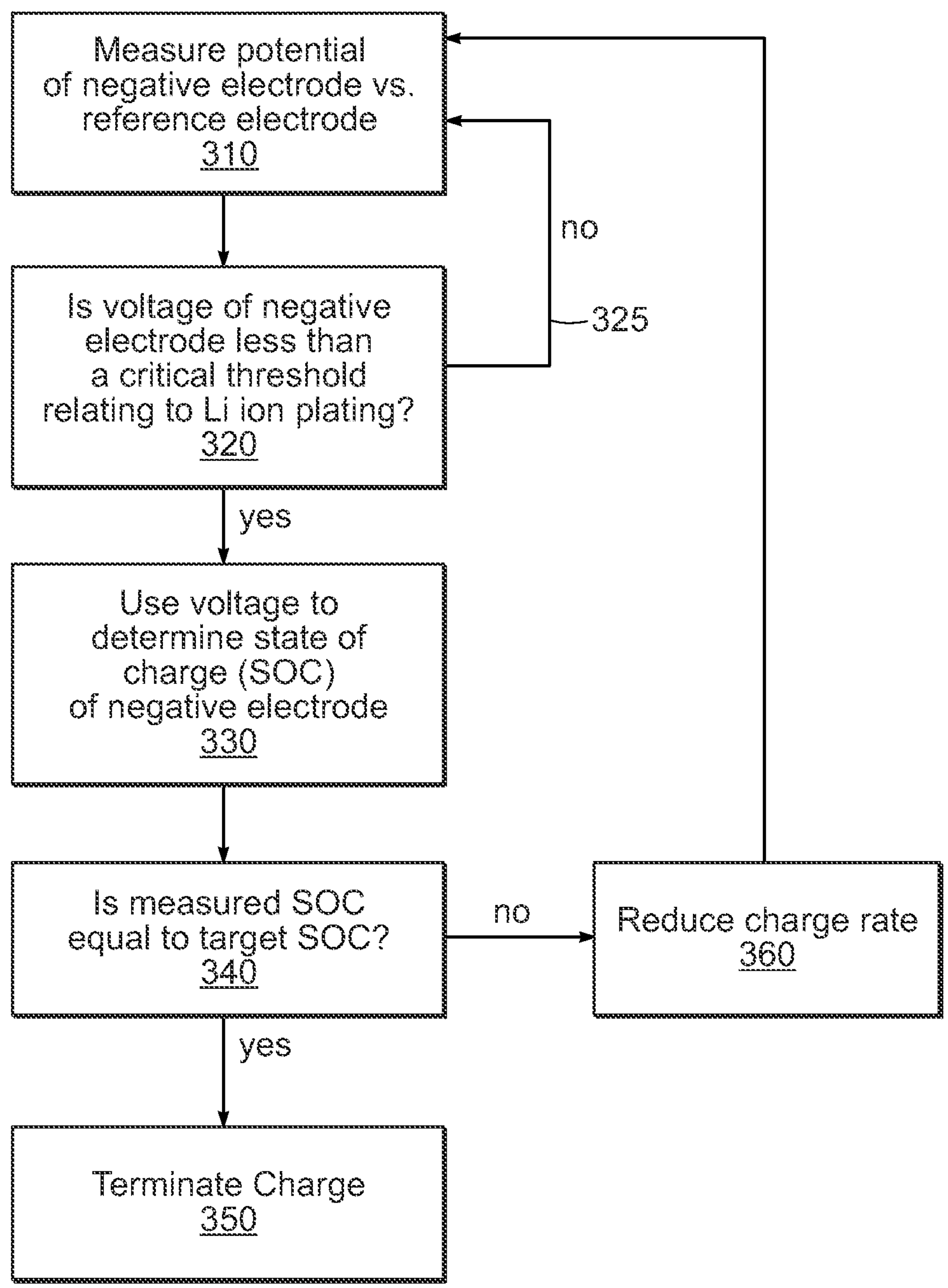
FIG. 3 is a flow diagram illustrating a method for monitoring a battery or battery pack according to one or more embodiments.

FIG. 3 illustrates the use of a reference electrode in monitoring a battery (single cell or battery pack) during a charging event. During charging the battery, the positive electrode can be delithiated and the negative anode can be lithiated to provide a desired state of charge to the cell. As noted above, the desired state of charge may be a fully charged state (100%) or some intermediate value (40-60% for HEVs), depending on the battery application.

In a particular embodiment, the cell can include a reference electrode and a pair of working electrodes and can be configured to measure the potential difference of the negative electrode and the reference electrode, as shown in step 310.

The information can be provided to a controller and the information can be compared with a predetermined voltage. For example, as shown in step 320, the voltage sensor can provide the potential difference across the negative electrode and the reference electrode to the controller and this value can be compared against a critical threshold voltage for which plating of lithium at the anode can occur. In certain embodiments, the critical threshold is set at a value greater than zero vs. $Li|Li^+$, as the resistance between the working and reference electrodes can affect the measurement of the potential difference between the working and reference electrodes. This higher threshold can help to ensure that the potential at the negative electrode surface in contact with the electrolyte does not become low enough to permit lithium metal plating. By way of example, a relatively conservative criterion may be to terminate charge before the voltage between the reference electrode and the negative current collector reaches 0.01 volts minus the equilibrium potential of the reference electrode versus Li. In other instances the lower limit of the voltage between reference electrode and negative current collector at which lithium plating does not occur can be determined experimentally.

If the potential difference is above the critical threshold, no action is taken and the system can continue to monitor the potential at the negative electrode (arrow 325).

If the potential difference is at or below the critical threshold, the controller can check the state of charge of the cell (step 330) to determine whether the target state of charge has been attained (step 340).

If the estimated SOC equals the target SOC, charging is deemed to be complete and charging can be terminated (step 350).

However, if the estimated SOC is less than the target SOC, charging can continue.

In certain embodiments, the charge rate can be lowered (step 360) to avoid a further reduction in the negative electrode potential so as to avoid lithium plating. Higher charge rates can result in greater ohmic drop in the electrolyte and can lower the potential below that at which lithium plating occurs, as described more fully in U.S. Pat. No. 7,262,979, the contents of which are incorporated by reference herein in their entirety.

Accordingly, monitoring the potential difference between the negative electrode and the reference electrode while charging can allow the charging process to be terminated before lithium plating occurs.

4. Optimizing Battery Charging Time

Figure 4:
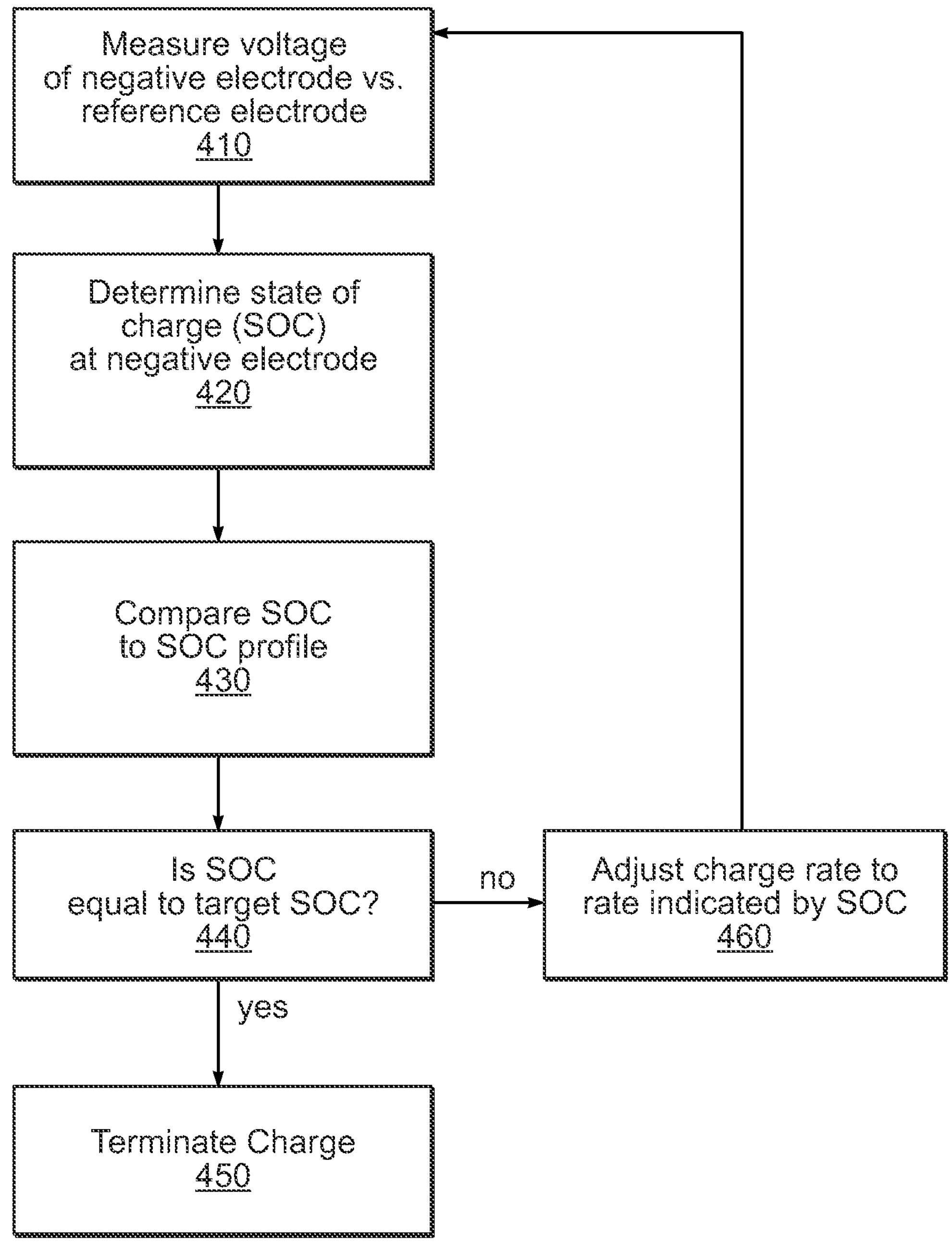
FIG. 4 is a flow diagram illustrating a method for monitoring a battery or battery pack according to one or more embodiments.

FIG. 4 illustrates another embodiment of the invention in which a reference electrode is utilized to minimize charge time. The charge current that is applied to charge the battery at any particular SOC can be optimized in real time and the charging profile can essentially be adjusted instantaneously. The reference electrode can allow instantaneous feedback of the SOC of each individual cell to the battery monitoring system and allows for real-time adjustment of the charging protocol. In contrast, conventional charging protocols cannot be adjusted in real time during a charging event by measuring the potentials at the electrodes.

As shown in step 410, the electrochemical cell can be configured to measure the potential difference between the negative electrode and the reference electrode. The measured potential difference can be provided to a controller, and the information can be combined with other information to estimate the state of charge of the cell, as shown in step 420. The estimated state of charge can be compared to a pre-stored state of charge profile in step 430. A state of charge (SOC) profile can be stored in the controller (or any other suitable medium) and can include data indicating the maximum permissible charge rate at a given state of charge. The maximum permissible charge rate can be determined from a number of factors, such as the potential reached at the negative electrode, cell temperature (in order to avoid overheating), and other safety factors. The SOC profile may be generated using empirical data, such as the measured or known variation in the negative electrode potential with SOC, or it may be calculated using a model of processes such as lithium diffusion in the negative electrode. If the estimated SOC is equal to or about the target SOC (step 440), then the battery charging can be terminated (step 450). If the estimated SOC is less than the target SOC, then the charge rate may be adjusted upwards or downwards to maintain a charge rate that provides one or more of optimal safety operation and optimal charge rate to minimize charge time (step 460). The charge current may be intermittently raised or lowered (pulsed) to determine the cell potentials that will result at a different current.

Accordingly, certain embodiments of the invention provide real-time adjustment of the charging step to minimize battery charging time. For instance, the charging time for a PHEV pack could be minimized by having continuous feedback to the charging source. Minimal charge time may be achieved because the maximum permitted charge rate (the maximum may be determined based on a variety of factors such as safety, polarization, etc.) is used for all SOC. By monitoring each cell in a battery pack, the system may be able to compensate for manufacturing variability of cells as well as changes over life. In other embodiments, pulse charge and intermittent current reversals may be implemented to avoid building up concentration gradients within the electrolyte or either electrode that can cause the potential to approach undesirable magnitudes. Thus, the reference electrode allows one to operate closer to the edge of maximum allowable charge rate.

EXAMPLES

The invention is illustrated in the following examples which are presented by way of example only and are not intended to be limiting of the invention.

Example 1

Li Ion Prismatic Cell Using Li Reference Electrode

Figure 5:
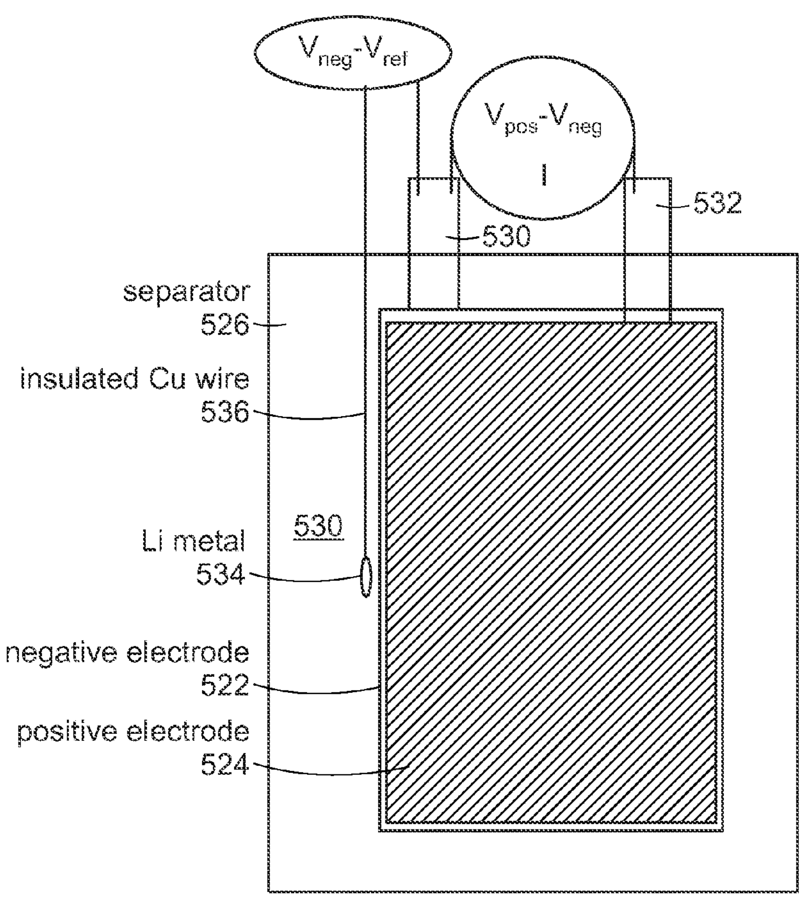
FIG. 5 is an exemplary electrochemical cell including a reference electrode according to one or more embodiments.
Figure 6:
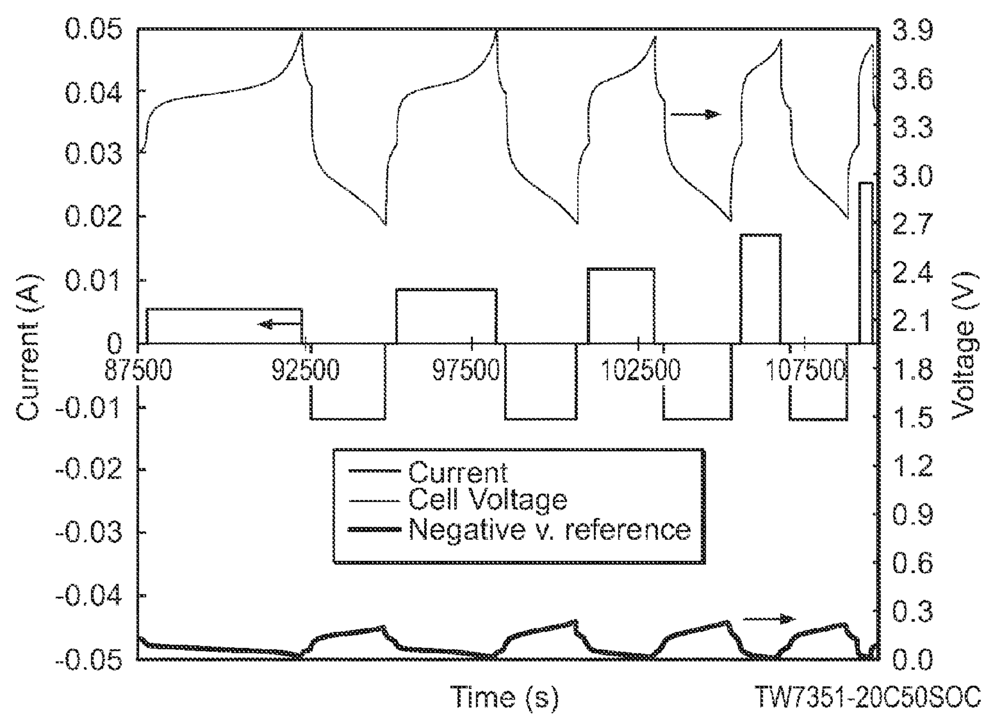
FIG. 6 shows a voltage profile of an exemplary electrochemical cell including a reference electrode during charge and discharge; the graph shows the potential of the negative electrode measured against the reference electrode, and also the cell voltage (positive vs. negative electrode). The reference electrode is used to determine when to terminate charging, in order to prevent lithium plating.

A prismatic cell was made by stacking a negative electrode 522, separator 526, and positive electrode 524, as shown in FIG. 5. A copper wire 536, insulated except for the tip, was placed adjacent to (but not in electrical contact with) the negative electrode 522, such that it was covered by the separator 526 but not between the active area of the anode 530 and cathode 532. Lithium metal 534 was then rolled onto the exposed end of the copper wire. The cell was filled with electrolyte ($LiPF_6$ in a mixture of carbonate solvents) and hermetically sealed. The cell went through some conditioning cycles at room temperature, then was placed in a Tenney temperature chamber and brought to −20° C. The cell was cycled on an Arbin battery cycler. FIG. 6 shows a voltage profile of such a cell during charge from 50% state of charge at different charging rates (0.3 C, 0.5 C, 0.7 C, 1 C, and 1.5 C), followed by discharge back to 50% SOC at the 0.7 C rate. The graph shows the potential of the negative electrode measured against the reference electrode (lower curve), and also the cell voltage (positive vs. negative electrode; upper curve). The current during charging and discharging operations is shown in the center. The ability of the reference electrode to control the charging of the cell is demonstrated. When the potential of the negative versus reference electrode drops below a predetermined limit, here, 5 mV, the battery monitoring system terminates charging to prevent lithium plating. As seen in FIG. 6, initial charging had a maximum potential of 3.9 V; however, successive discharge/charge cycles show increasingly smaller maximum potentials. This is because the reference vs. negative electrode reached 5 mV before that point and charging was terminated.

Figure 12:
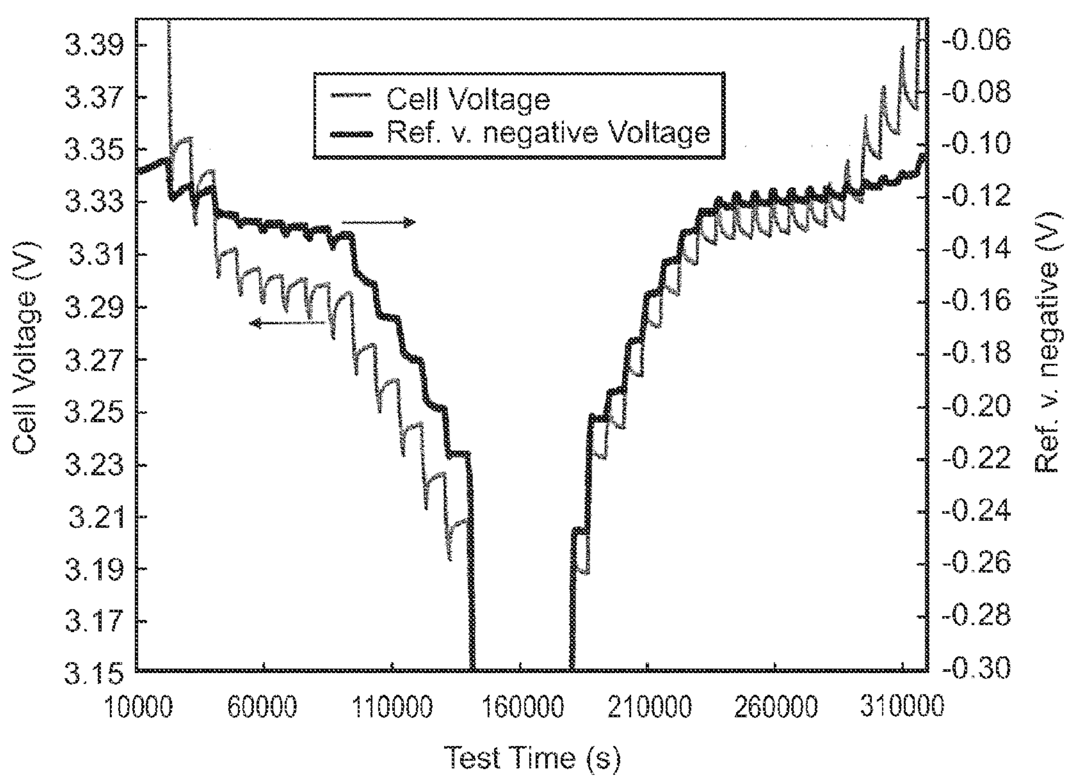
FIG. 12 shows the voltage profile of a cell containing a lithium reference electrode, starting fully charged, discharging in 5% SOC increments to 0% SOC, then charging in 5% SOC increments to 100% SOC, with 2 hour rests between each current event.

FIG. 12 shows the benefit of the reference electrode for monitoring state of charge. The cell was fully charged, then discharged by 5% state of charge, with each discharge followed by a 2 hour rest. After the cell was completely discharged, the procedure was reversed, with the cell being charged in 5% state of charge increments, with 2-hour rests in between. FIG. 12 shows the cell voltage and reference v. negative voltage versus time (the cell is at 100% state of charge at the left of the figure, at 0% state of charge at time=160000 seconds, and again at 100% state of charge at the right of the figure). The potential of the negative electrode has a clear relationship to state of charge. The use of the reference electrode has two benefits. First, the polarization on the negative electrode relaxes more quickly than the overall cell voltage, because of the faster diffusion time constant in the negative electrode. Therefore, the potential of the negative electrode more quickly relaxes back to its true open-circuit voltage, and there is less error from relaxation of polarization when trying to correlate potential to state of charge. The second benefit is that there is less hysteresis in the potential of the negative electrode vs. reference electrode than in the overall cell voltage, which contains contributions to hysteresis from both the negative and positive electrode materials in this particular case. Therefore, the error from hysteresis is lower when using the neg v. ref voltage to determine state of charge.

Example 2

Li Ion Prismatic Cell Using $Li_4Ti_5O_{12}$ (LTO) Reference Electrode

Sample A: A reference electrode was prepared by coating a slurry of $Li_4Ti_5O_{12}$ (LTO), binder, and conductive additive onto a region of a piece of copper foil, then drying the slurry, calendaring the coating, and cutting the foil into narrow strips, each coated with LTO at one end of the strip. The uncoated part of the copper strip was insulated with tape to create a barrier to electrolyte contact. A prismatic cell was assembled as described in Example 1, with the additional step that a fourth electrode, comprised of Al foil with a patch of lithium iron phosphate, sized to match the LTO reference electrode, was placed on top of the separator covering the LTO reference electrode. After the cell was filled with electrolyte and hermetically sealed, current was passed between the auxiliary lithium iron phosphate electrode and the LTO reference electrode, to activate the LTO reference electrode to its two-phase plateau. To activate the $Li_4Ti_5O_{12}$ reference electrode, a closed circuit is formed between the reference and external terminals and sufficient current is allowed to flow such that the reference electrode is lithiated to a capacity, e.g., of between 5 and 150 mAh/g with respect to the $Li_4Ti_5O_{12}$.

Figure 11:
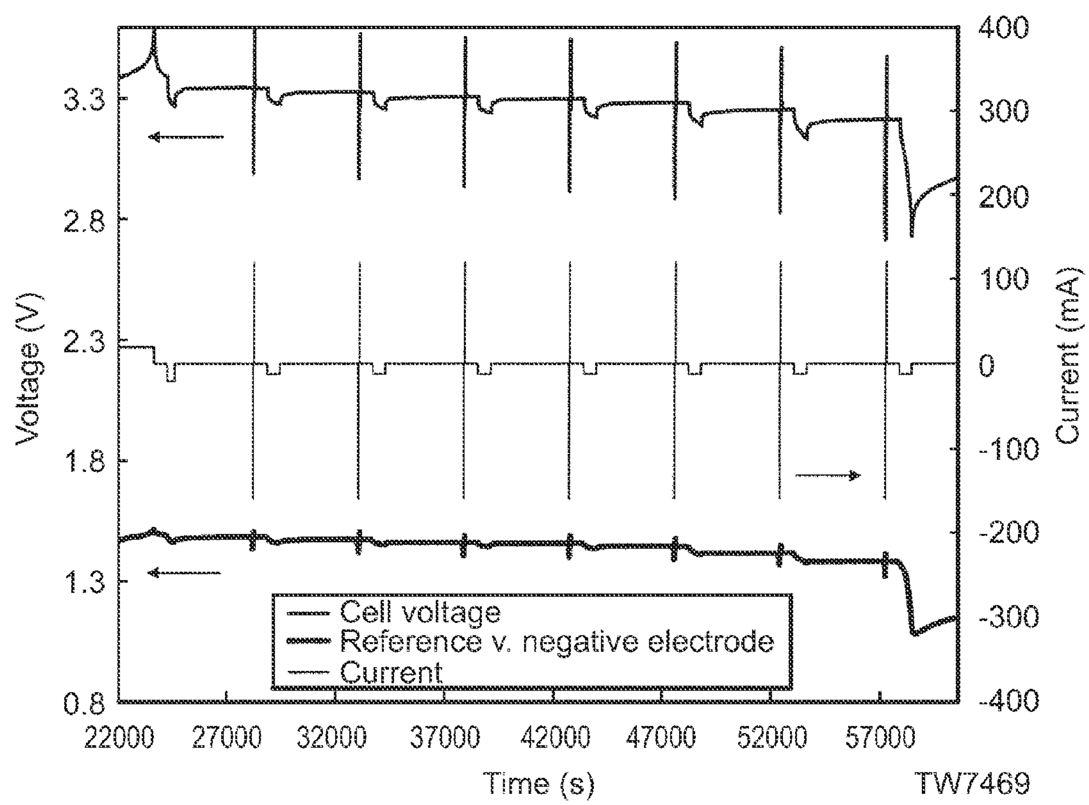
FIG. 11 shows the voltage profile from a cell containing an LTO reference electrode during an HPPC test. By comparing the voltage drop in the cell voltage to that in the neg. v. ref. voltage upon change in current, the impedance of the entire cell can be compared versus that of the negative electrode.

The cell was tested under the HPPC procedure developed by USABC (T. Q. Duong, J. Power Sources vol. 89#2, 244 (2000)). This procedure measures the discharge and charge impedance of the battery at every 10% state of charge. The cell voltage and the voltage between the reference electrode and negative electrode (ref. v. neg.) are shown in FIG. 11. The cell voltage includes impedance from the separator and positive electrode, whereas the ref. v. neg. voltage includes only the impedance from the negative electrode. FIG. 11 shows that, in this particular cell, the impedance of the positive electrode and separator are much larger than the impedance of the negative electrode, because the voltage change upon change in current is much larger in the cell voltage than in the ref v. neg. voltage.

A cylindrical cell 1410 is fabricated with a reference electrode 1415 prepared as described in Example 2A by coating LTO 1420 onto metal foil 1425, as illustrated in FIG. 14A. The uncoated part of metal foil 1425 is insulated with tape 1430 to create a barrier to electrolyte contact. FIG. 14B illustrates reference electrode 1440 deposited directly onto an interior surface of can 1410 according to some embodiments.

Sample B: A prismatic cell is made by stacking multiple repeat units of negative electrode, separator, and positive electrode, as described in Example 1. A reference electrode is prepared as described in Example 2A by coating LTO onto metal foil, e.g. Ni, Cu, or stainless steel foil. Foil uncoated by LTO is insulated by coating it with a material impermeable to electrolyte, e.g. polyurethane. The LTO-coated region of the reference electrode is covered with a porous, insulating material that wicks electrolyte, such as microporous polyethylene, a mixture of insulating ceramic particles with binder such as $Al_2O_3$ with PVDF, or other material commonly used for battery separators. The reference electrode is then placed adjacent to the edge of the bottom anode layer. The cell is filled with electrolyte and hermetically sealed. To activate the $Li_4Ti_5O_{12}$ reference electrode, a closed circuit is formed between the reference and positive electrode terminals and sufficient current is allowed to flow such that the reference electrode is lithiated to a capacity of between 5 and 150 mAh/g with respect to the $Li_4Ti_5O_{12}$.

Example 3

Cylindrical Cell Using Cell can as Reference Electrode Terminal

Figure 7:
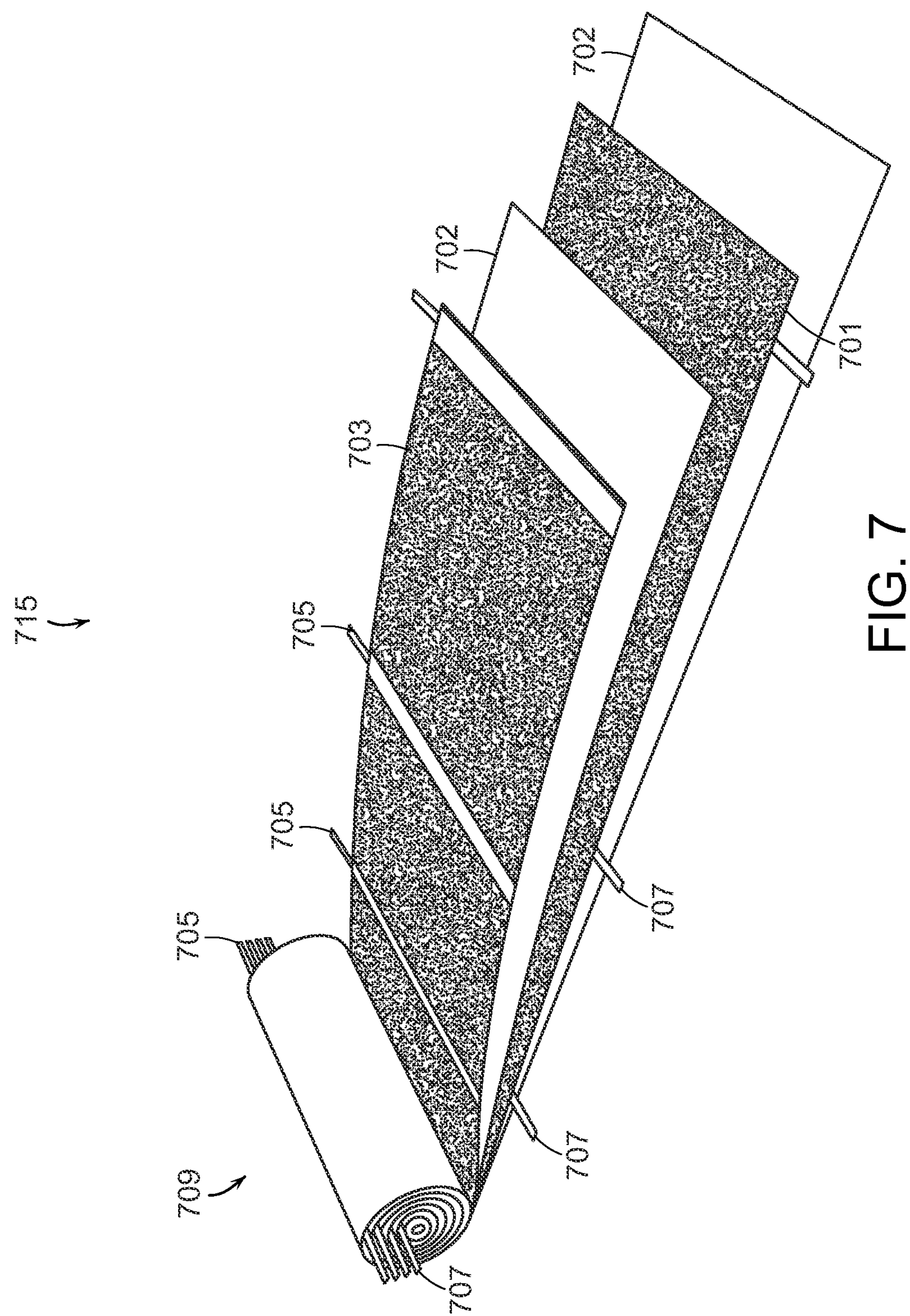
FIG. 7 is a perspective illustration of a typical spiral electrode secondary cell according to one or more embodiment.

A cylindrical cell is made by winding multiple repeat units of negative electrode, separator, and positive electrode, as illustrated in FIG. 7.

An exemplary lithium ion battery includes a battery element having a cathode and an anode, which are separated by a microporous separator which are tightly wound together and placed in a battery can. A typical spiral electrode secondary cell is shown in FIG. 7. The secondary cell 715 includes anode sheet 701 that includes anode materials coated onto both sides of an anode current collector, a separator 702 and cathode sheet 703 that includes cathode material coated onto both sides of cathode current collector that have been stacked in this order and wound to make a spiral form 709. The cathode sheets 703 include current collector leads 705 and the anode sheets 701 include current collector leads 707. An electrolytic solution is added to the can.

Figure 8:
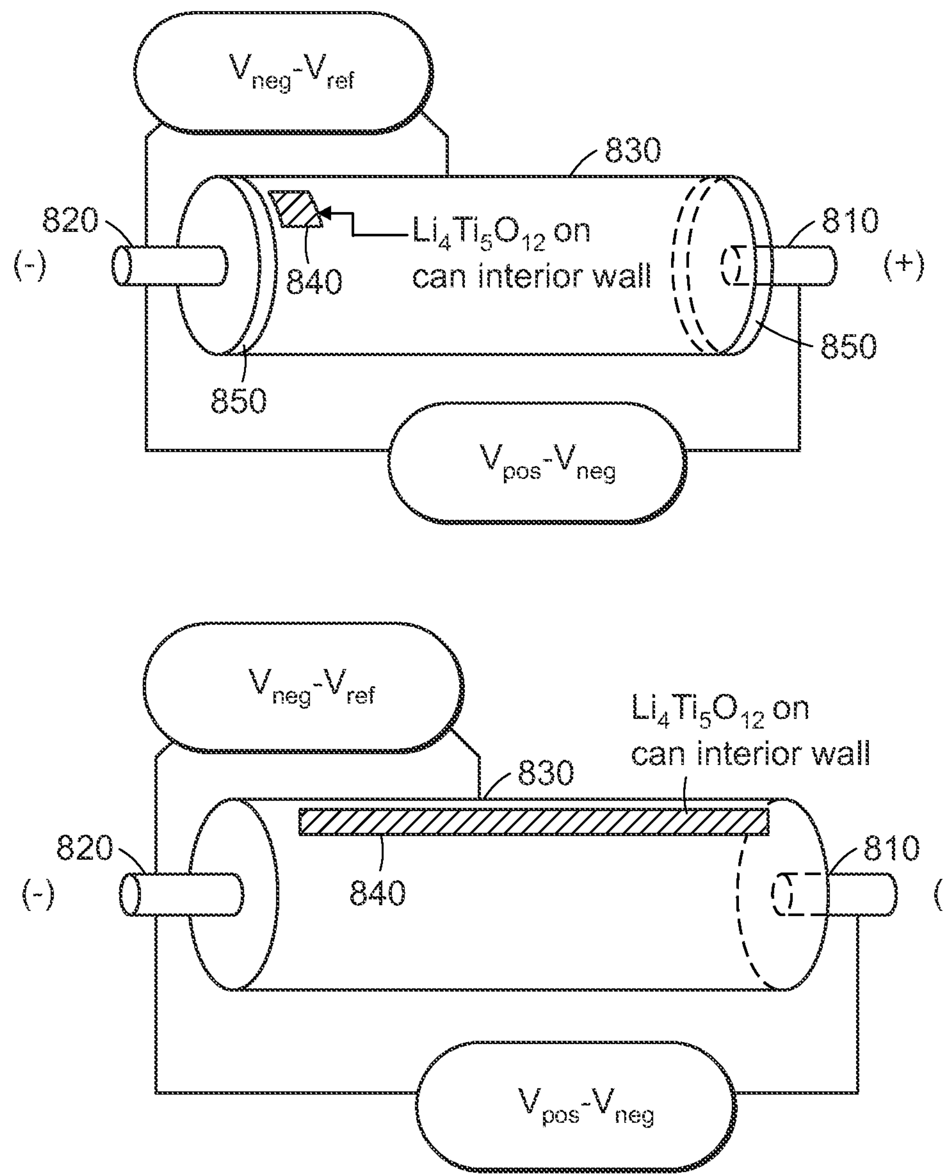
FIG. 8 is a perspective illustration of a cylindrical cell including a reference electrode according to one or more embodiment.

A cylindrical cell including a reference electrode is fabricated as described with reference to FIGS. 7 and 8. The spirally wound cell 709 is inserted into a battery can 830. A battery cell can include upper and lower welded end caps. The cell's primary packaging (can and end caps) can be composed of aluminum alloy. The weld seal is typically obtained by laser welding, or optionally by other metal joining methods such as ultrasonic welding, resistance welding, MIG welding, TIG welding. The end caps of the doubly (upper and lower ends) welded container may be thicker than the can wall; e.g., the end caps may be up to about 50% thicker than the can wall. An anode lead 705 is connected to the negative terminal 820. The cylindrical cell includes a positive terminal 810 located at one end, a negative terminal 820 at the other end, and the steel or aluminum cylindrical can 830 at floating potential (i.e., electrically isolated from both electrodes). The cathode lead 705 provides electrical contact with the positive terminal 810 and the anode lead 707 provides electrical contact with the negative terminal 820.

To provide a reference electrode without requiring a third terminal to exit the cell, a reference electrode material 840 is applied to the interior wall of the can, and the exterior of the can is used as the reference terminal, and is no longer at floating potential. In one instance, a slurry of $Li_4Ti_5O_{12}$ as described in Example 2 is applied to an inside surface of an aluminum can in the shape of a line extending part or all of the length or circumference of the can. In another instance, a small "patch" of the slurry is applied on the interior surface of the can near the negative terminal. The reference electrode is electronically isolated from the wound electrode by an electrolyte-permeable polymer or fiber separator, which may in one instance be the electronically insulating outer wrap on the wound electrode, and in another instance may be a separate film applied over the reference electrode. The $Li_4Ti_5O_{12}$ reference electrode is activated as described in Example 2b. Gaskets 850 electrically isolate terminals 810 and 820 from can 830.

Providing a reference electrode without requiring a third terminal to exit the cell, as described above, has several advantages. An additional hermetic feed-through is not required for the reference electrode. Such an additional feed-through would add a potential electrolyte leak path to the system, take up additional space, and increase the weight of the battery. When a reference electrode material is applied to an interior wall of an electrically conductive can, the use of the exterior of the can as the reference terminal can simplify cell design.

Example 4

Figure 10:
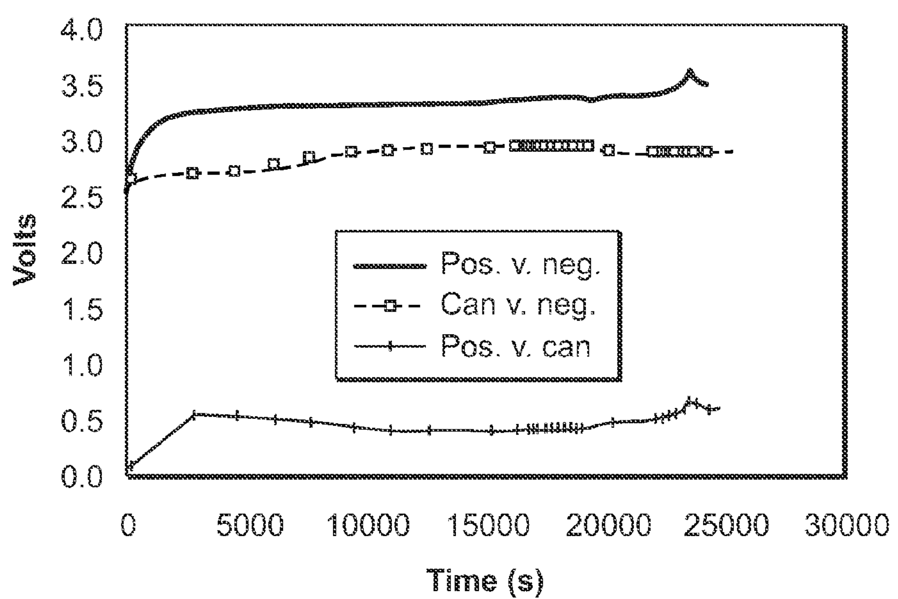
FIG. 10 illustrates the voltage profile during charge from a cylindrical cell in which the terminals are electrically isolated from an aluminum can, and the can is used as a pseudoreference electrode.

Cylindrical Cell Using Cell Can as Reference Electrode/Reference Electrode Terminal A cylindrical cell was manufactured as described in Example 3. The positive terminal, negative terminal, and can are all electrically isolated from each other via insulating polymer gaskets between the terminals and cans. The can is made from aluminum. The aluminum serves as a pseudoreference electrode, which maintains a constant potential as long as no net charge is passed to the pseudorefence electrode. The cell voltage is measured between the negative and positive terminals. In addition, the voltage between the can and negative terminal is monitored. Zero net charge can be maintained by also monitoring the voltage between the positive terminal and can, or by alternating the connection of leads (first measuring can v. negative terminal, then negative terminal v. can). FIG. 10 shows the measured voltages during a charge at a rate of 0.2 times the rated cell capacity. The can, acting as pseudoreference, is able to detect that the increase in cell voltage at the end of charge is caused by an increase in the potential of the positive electrode, while the potential of the negative electrode is constant at the end of this low-rate charge.

Example 5

Cell Using Additional Third Terminal in Cell Cap for Reference Electrode

Figure 9:
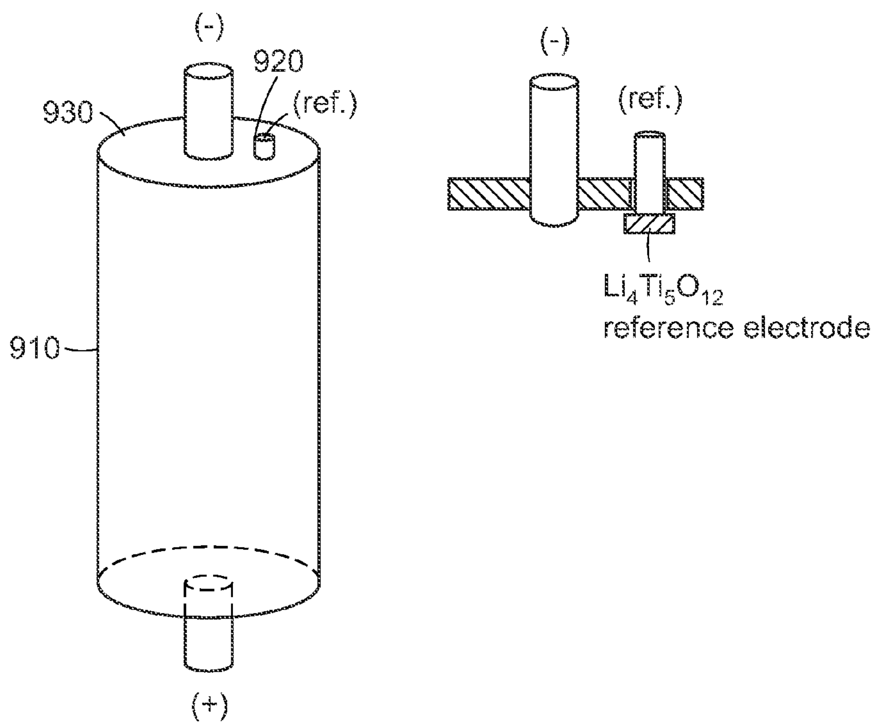
FIG. 9 is a perspective illustration of a cylindrical cell fabricated with a reference electrode terminal through the cell endcap according to one or more embodiment.

A cylindrical cell 910 is fabricated with a reference electrode terminal 920 through the cell endcap 930, as illustrated in FIG. 9. This terminal 920 is electronically insulated from the endcap 930 and from the terminal passing through the endcap. On the interior of the cell, the reference electrode terminal is electrically connected to a reference electrode. In one instance, the reference electrode is $Li_4Ti_5O_{12}$, fabricated and electronically isolated as described in Examples 2 and 3, and is positioned immediately adjacent to the active area of the jellyroll adjacent to the anode tab.

Example 6

Battery Monitoring System Using Three Electrode Cell

A battery pack contains multiple modules wired in parallel, each module consisting of a string of series-wired cylindrical lithium ion cells, said cells having a doped nanoscale lithium iron phosphate cathode, a carbon anode, and a lithium titanate reference electrode as described in Example 3. Electronic circuits on each module are used to perform individual cell balancing, fault detection, and temperature monitoring. The main monitoring system for the pack performs module fault signal aggregation, dc bus voltage and current monitoring, pack state-of-charge estimation, module enabling and external fault and status reporting. The voltage between the lithium titanate reference electrode and the carbon negative electrode, $V_1$, as well as the cell voltage, is monitored at each cell.

The battery pack is charged using a constant voltage, current-limited DC power source with an upper current limit of 10 A to each module. The maximum charge current is monitored using the $V_1$ output of the cells in each module.

During charging of the pack, each module in the battery pack is initially charged with a current of 10 A as long as the module monitoring system indicates that the initial SOC of all cells in the module is below 85%. The initial state-of-charge is determined according to a look-up table defining a specific state-of-charge with a specific $V_1$ value under cell open-circuit conditions. The SOC of cells is determined periodically from the voltage $V_1$ under open circuit conditions. As the SOC of any one cell in a module reaches 85%, the charge current to the module is decreased to 7.5 A. At 90% SOC the current to the module is reduced to 5 A, and at 95% the current is reduced to 1 A. The module charge current is shut off when $V_1$ in any one of its series-connected cells has increased above 1.55 V (for an LTO reference electrode which is 1.56 V positive of lithium). For overcharge protection, if $V_1$ in any one of the cells in a module increases above 1.55 V for 10 seconds while charging, an error condition is reported from that module to the main monitoring system, which then reports a module failure and logs the incident for later diagnostics.

Cell balancing is also accomplished using the output $V_1$. The control circuit in each module works to balance the $V_1$ values of each of the cells with each other. The balancing circuits are designed to dissipate about 250 mA of excessive charge current around each cell in the instance of cylindrical cells of 26650 form factor. When the cells have equal $V_1$, the balancing current settles to zero.

Impedance growth in each cell is monitored periodically and the data recorded by the module or main monitoring system. Individual cell impedance is monitored by charging or discharging each module of series-connected cells with a current pulse and determining the potential drop at the positive and negative electrodes from the measurement of $V_1$ for the cell and the cell voltage. The voltage drop divided by the charge or discharge current provides an impedance value for both electrodes in each cell. This data is recorded periodically during the life of the pack.

For pack diagnostics, queries from a diagnostic reader can ask and receive the following information from the battery pack:

- Number of presently failed modules (if any), based on the $V_1$>1.55 V for 10 s criterion
- Other Alerts or Issues (battery impedance, high temperature, high charge current, etc.)
- Temperature history
- Cell voltage history
- Hours of operation
- Estimated impedance (Ω), and growth since date of manufacture (%)

The following commands can then be sent to the battery pack

- Enable Balancing
- Disable Balancing
- Reset module Fault states
- Reset diagnostic data (history)

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

The invention claimed is:

1. A battery, comprising:

first and second working electrodes separated by at least one separator, the first working electrode in electrical connection with a first terminal, and the second working electrode in electrical connection with a second terminal;

one or more reference electrodes; and a can housing the working electrodes and the one or more reference electrodes, wherein the can is electrically isolated from the first and second terminals and the one or more reference electrodes are integral to the can so that the can is electrically connected to the one or more reference electrodes to provide terminals for the one or more reference electrodes with the exterior of the can, and exposed metal surfaces of the can are coated with a nonporous electrically insulating coating.

2. The battery of claim 1, wherein the battery is a lithium ion battery and the working electrodes comprise electroactive materials capable lithium uptake and release.

3. The battery of claim 1, wherein the battery comprises a cylindrical cell of wound construction.

4. The battery of claim 1, wherein the battery comprises a prismatic cell of wound or stacked construction.

5. The battery of claim 2, wherein the one or more reference electrodes are comprised of an electroactive material capable of multiphase existence to provide a substantially constant voltage between about 1 V and about 4 V with respect to $Li/Li^{+}$.

6. The battery of claim 2, wherein the one or more reference electrodes are capable of interface with a battery management system for the charging of the battery and for monitoring state of charge.

7. The battery of claim 2, wherein the one or more reference electrodes have as little as about 0.001% and up to as much as about 20% of the coulombic capacity of the working electrodes.

8. The battery of claim 2, wherein the one or more reference electrodes are selected from the group consisting of lithium titanium oxide, lithium transition-metal phosphate, lithium manganese spinel, with or without substituent elements, and alloys of lithium with metals such as tin, aluminum, and antimony.

9. The battery of claim 2, wherein the battery is one of a plurality of batteries comprising a battery pack.

10. The battery of claim 2, wherein the one or more reference electrodes are positioned at a location in the battery most susceptible to lithium plating during charge.

11. The battery of claim 2, wherein the one or more reference electrodes are located between the working electrodes.

12. The battery of claim 2, wherein the one or more reference electrodes are substantially adjacent to the edge of the negative electrode, and prevented from contacting the negative electrode by a porous, electronically insulating layer.

13. The battery of claim 2, wherein the active material for the one or more reference electrodes is coated onto at least part of a wall of the can.

14. The lithium-ion battery of claim 13, wherein the can consists of a metal from the group comprising aluminum, copper, stainless steel, and titanium and the can provides both the reference electrode and the reference electrode terminal.

15. The battery of claim 2, wherein the first and second terminals are located in upper and lower cover plates, respectively.

16. The lithium-ion battery of claim 15, wherein the first and second terminals are electrically isolated from the can via gaskets.

17. The battery of claim 2, wherein the one or more reference electrodes are wrapped in a porous electronically isolating material that is electrochemically inert.

18. The lithium-ion battery of claim 17, where the porous electronically insulating material is wetted by the battery electrolyte.

19. The battery of claim 2, wherein the one or more reference electrodes are applied to the interior wall of the can.

* * * * *